United States Patent
Nakagawa

(10) Patent No.: US 8,034,727 B2
(45) Date of Patent: Oct. 11, 2011

(54) METHOD AND APPARATUS FOR MANUFACTURING SEMICONDUCTOR DEVICES

(75) Inventor: Takashi Nakagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 644 days.

(21) Appl. No.: 12/083,214

(22) PCT Filed: Oct. 13, 2006

(86) PCT No.: PCT/JP2006/320887
§ 371 (c)(1),
(2), (4) Date: Apr. 7, 2008

(87) PCT Pub. No.: WO2007/043709
PCT Pub. Date: Apr. 19, 2007

(65) Prior Publication Data
US 2009/0253229 A1  Oct. 8, 2009

(30) Foreign Application Priority Data

Oct. 14, 2005  (JP) .................................. 2005-299762

(51) Int. Cl.
*H01L 21/31* (2006.01)
*H01L 21/469* (2006.01)
(52) U.S. Cl. .................. 438/785; 438/790; 257/E21.01; 427/255.15
(58) Field of Classification Search .................. 438/789, 438/784, 790, 785; 257/E21.513, E21.478, 257/E21.01; 427/96.8, 98.6, 255.15
See application file for complete search history.

(56) References Cited

U.S. PATENT DOCUMENTS

| 6,806,211 B2 | 10/2004 | Shinriki et al. |
| 7,396,565 B2 * | 7/2008 | Yang et al. ................ 427/255.32 |
| 7,402,534 B2 * | 7/2008 | Mahajani ...................... 438/785 |
| 2007/0141257 A1 * | 6/2007 | Takahashi et al. ........ 427/255.31 |

FOREIGN PATENT DOCUMENTS

| JP | 2001-203198 A | 7/2001 |
| JP | 2002-151489 A | 5/2002 |
| JP | 2003-209110 A | 7/2003 |
| JP | 2003-347297 A | 12/2003 |
| JP | 2004-079753 A | 3/2004 |
| JP | 2005-045166 A | 2/2005 |

OTHER PUBLICATIONS

Y. Okuyama et al., "Batch process for atomic layer deposition of hafnium silicate thin films on 300-mm-diameter silicon substrates," J. Vac. Sci. Technol. A. vol. 23:3, May/Jun. 2005, pp. L1-L3.
M. L. Green et al., "Nucleation and growth of atomic layer deposited $HfO_2$ gate dielectric layers on chemical oxide (Si-O-H) and thermal oxide ($SiO_2$ or Si-O-N) underlayers," Journal of Applied Physics, vol. 92:12, Dec. 2002, pp. 7168-7174.

* cited by examiner

Primary Examiner — Caridad Everhart
(74) Attorney, Agent, or Firm — Foley & Lardner LLP

(57) ABSTRACT

A semiconductor device manufacturing method according to the present invention uses a first raw material gas containing Si, a second raw material gas containing a metal element M and an oxidation gas, in which a first step of supplying the oxidation gas onto a substrate to be treated, and a second step of supplying the first raw material gas are sequentially performed. The method further includes, after the first and second steps, a step of supplying the second raw material gas or gas mixture of the first raw material gas and the second raw material gas.

18 Claims, 30 Drawing Sheets

ADSORPTION SITE FORMATION PROCESS

Si RAW MATERIAL SUPPLY PROCESS

SUPPLY PROCESS OF GAS MIXTURE OF Hf AND Si RAW MATERIALS

GROWTH TERMINATION

METHOD AND APPARATUS FOR MANUFACTURING SEMICONDUCTOR DEVICES

This application is the National Phase of PCT/JP2006/320887, filed Oct. 13, 2006, which claims priority to Japanese Application No. 2005-299762, filed Oct. 14, 2005, the disclosures of which are hereby incorporated by reference in their entirety.

TECHNICAL FIELD

The present invention relates to a semiconductor device manufacturing method and apparatus, and in particular to a semiconductor device manufacturing method and apparatus suitable for producing MOSFET (Metal Oxide Semiconductor Field Effect Transistor) gate insulation film.

BACKGROUND ART

As the size of transistors is miniaturized in high-tech CMOS (complementary MOS) devices, the thickness of gate insulation films is reduced. This induces a problem of increased gate leak current. A technology has been studied to reduce the gate leak current by using a material having a high dielectric constant (high-k material) for the gate insulation film to increase the physical thickness thereof. Oxides containing Hf, Zr, Al, Ta, or the like may be cited as typical examples of the high-k materials. Another technology has recently been studied to improve the mobility of carriers, improve the on-current, and reduce the GIDL (Gate Induced Drain barrier Lowering) by a method in which a high-k material is inserted into an interface between a gate electrode and $SiO_2$ or SiON forming a gate insulation film so that the transistor threshold voltage is adjusted according to a deposition density of the inserted high-k material so as to reduce the impurity concentration in the channel region. In this method, a deposition density of the metal element forming the high-k material required to set the transistor threshold voltage to an appropriate value is desirably 1E14 (or $1\times10^{14}$) atoms/cm$^2$ or lower.

A film of the above-mentioned high-k material may be formed by diverse film formation methods such as sputtering method, CVD (Chemical Vapor Deposition) method, and atomic layer adsorption/deposition method. However, the sputtering method entails a fear that gate insulation film may be affected by plasma damage during the film formation. The CVD method eliminates the effect of plasma damage being a cause for the problem in the sputtering method, and is suitable for formation of a film of a mixture of the high-k material and silicon. However, there exists in the film formation process an incubation time in which the film thickness and the film formation time are not proportional. This leads to a problem of controllability, in-plane uniformity, and reproducibility of the film thickness. Additionally, it becomes difficult to ensure the in-plane uniformity or reproducibility of the film thickness depending on process conditions such as film formation temperature or raw material gas distribution. As for the atomic layer adsorption/deposition method, in contrast, its film formation mechanism utilizing saturated adsorption of a raw material is able to realize more favorable uniformity and reproducibility in comparison with the CVD method. Further, it is believed that the atomic layer adsorption/deposition method is most suitable for controlling the deposition density of the metal element since, in principle, the film formation in units of molecular layers is possible. However, even in the atomic layer adsorption/deposition method, there exists incubation time in which the film growth rate is low in an initial stage of the film formation. Therefore, the atomic layer adsorption/deposition method requires improvement in the controllability, reproducibility, and in-plane uniformity of the metal element deposition density.

For example, Non-Patent Document 1 (Journal of Applied Physics, Vol. 92, No. 12, 15 Dec. 2002, pp. 7168-7174) describes formation of a $HfO_2$ film by an atomic layer adsorption/deposition method, in which the deposition density of Hf element per cycle is 1.26E14 atoms/cm$^2$, and the film formation rate is 0.5 Å per cycle. It also describes that the deposition density of Hf element differs significantly depending on the surface state of a substrate to be treated. For example, comparing the cases in which a silicon substrate has a chemical oxide film and it has a thermal oxide film on the surface thereof, the Hf deposition amount per cycle on the one with the thermal oxide film is about a half of that on the one with the chemical oxide film. This phenomenon is particularly remarkable in the initial stage of the film formation (in a region where the number of cycles is 20 or less) to impair the linearity of the Hf deposition density to the number of cycles, which proves the existence of the incubation time.

Patent Document 1 (Japanese Laid-Open Patent Publication No. 2004-79753) discloses a technique in which atomic-layer adsorption/deposition of $HfO_2$ is performed by using tetrakis(diethylamino)hafnium ($Hf[N(C_2H_5)_2]_4$) as a raw material and $O_3$ as an oxidizing agent and alternately supplying them onto a silicon substrate. In this technique, a film formation rate of 0.8 Å per cycle is realized. An in-plane uniformity of film thickness of about 7% is realized. The in-plane uniformity is computed by (maximum measurement value-minimum measurement value)/(average measurement value$\times 2)\times 100(\%)$.

Further, Non-Patent Document 2 (Journal of Vacuum Science Technology, A23(3), May/June 2005, L1-L3) reports that atomic-layer adsorption/deposition of HfxSi(1−x)O$_2$ is performed by using tetrakis(ethyl-methyl-amino)hafnium ($Hf[N(C_2H_5)(CH_3)]_4$) as an Hf raw material, tetrakis(ethyl-methyl-amino)silicon ($Si[N(C_2H_5)(CH_3)]_4$) as an Si raw material, and $O_3$ as oxidation gas, and alternately performing a simultaneous supply of the Hf raw material gas and the Si raw material gas and a supply of $O_3$, and a film formation rate of 0.8 Å per cycle has been realized.

Patent Document 2 (Japanese Laid-Open Patent Publication No. 2003-347297) discloses a technique in which atomic-layer adsorption/deposition of HfxSi(1−x)O$_2$ is performed by using tetrakis(dimethyl-amino)hafnium as an Hf raw material, tetramethoxy-silane ($Si(O CH_3)_4$) as an Si raw material, and an oxidizing agent, and supplying the Hf raw material, the oxidizing agent, the Si raw material, and the oxidizing agent sequentially in this order onto the substrate in each cycle. In this case, a film formation rate of 2 Å per cycle is realized.

Patent Document 3 (Japanese Laid-Open Patent Publication No. 2002-151489) discloses an atomic layer adsorption/deposition method for forming a $ZrSiO_4$ film, in which $ZrCl_4$ and $SiCl_4$ are used as raw material gases while $H_2O$ is used as an oxidation gas, and a $ZrCl_4$ supply step, a purge step, an $H_2O$ supply step, a purge step, an $SiCl_4$ supply step, a purge step, and an $H_2O$ supply step are sequentially performed as one cycle to alternately deposit a $ZrO_2$ molecular layer and an $SiO_2$ molecular layer.

However, the film formation techniques above have problems as described below.

In the first place, it is difficult according to the conventional atomic layer adsorption/deposition methods to reduce the deposition density of metal elements per cycle due to their film formation mechanisms. Specifically, according to these conventional methods, one molecular layer is formed per cycle and, therefore, the deposition density cannot be made lower than the deposition density of the molecular layer. For example, the $HfO_2$ film formation rate per cycle in the above-mentioned conventional examples is from 0.5 Å to 0.8 Å. In that case, the Hf deposition density per cycle is from $1.26E14$ atoms/$cm^2$ to $1.8E14$ atoms/$cm^2$. Accordingly, it is impossible to obtain the above-mentioned favorable deposition density per cycle of $1E14$ atoms/$cm^2$ or low.

In the second place, according to the conventional atomic layer adsorption/deposition methods, the incubation time exists depending on the surface state or the like of a substrate to be treated, and hence the deposition amount per cycle varies. This induces a problem of difficulty in ensuring the controllability, in-plane uniformity, and reproducibility of the deposition density.

In the third place, according to the conventional CVD methods, the film thickness varies due to the existence of the incubation time, which induces a problem of deterioration of the controllability, in-plane uniformity, and reproducibility of the film thickness.

In the fourth place, the metal element deposition density may be reduced in molecular layer units by a method of forming a film of a mixture of the metal element and Si element by means of the atomic layer adsorption/deposition method. However, for example, when an $HfxSi(1-x)O_2$ is formed by the atomic layer adsorption/deposition method by supplying the Hf raw material and the Si raw material simultaneously, the Hf and Si atoms are deposited on the substrate to be treated by competitive adsorption between them. Therefore, it is difficult to ensure the reproducibility and uniformity of the composition.

In the fifth place, the incubation time exists also when a hafnium silicate film is formed by a method in which an Hf raw material, an oxidizing agent, an Si raw material, and an oxidizing agent are sequentially supplied onto a substrate to be treated to perform atomic-layer adsorption/deposition in one cycle. This makes it difficult to ensure the controllability of deposition density and the reproducibility and in-plane uniformity of film thickness. In addition, the $HfO_2$ and $SiO_2$ layers are formed in a stacked structure on the surface of the substrate to be treated, which causes a problem that the Hf deposition concentration cannot be reduced in the units of molecular layers. Further, according to this supply method, the thickness of the stacked $SiO_2$ film must be increased to reduce the density of Hf element in the film. As a result, the EOT (effective oxide thickness) of the gate insulation film as a whole is increased.

It is an object of the present invention to reduce the incubation time, and to thereby suppress the variation in film thickness, improve the in-plane uniformity and reproducibility, and to enhance the controllability of metal element deposition density.

DISCLOSURE OF THE INVENTION

A first aspect of the present invention provides a semiconductor device manufacturing method including a film formation method for forming a film of a metal oxide containing a metal element M and Si as components on a substrate to be treated containing at least Si as constituent elements by using a first raw material gas containing Si, a second raw material gas containing the metal element M, and an oxidation gas. The manufacturing method is characterized by sequentially performing a first step of supplying the oxidation gas, a second step of supplying the first raw material gas, and a third step of supplying gas containing the second raw material gas, onto the substrate to be treated.

In the manufacturing method, the second raw material gas or gas mixture of the second raw material gas and the first raw material gas may be supplied as the third step.

Further, in the manufacturing method, a fourth step of supplying the oxidation gas onto the substrate to be treated may be performed following the third step and, further, one or a plurality of cycles each consisting of the second step to the fourth step may be performed.

Further, in the manufacturing method, a fourth step of supplying the oxidation gas onto the substrate to be treated may be performed subsequently to the third step and, further, one or a plurality of cycles each consisting of the third step to the fourth step may be performed.

Further, in the manufacturing method, a fourth step of supplying the oxidation gas onto the substrate to be treated may be performed subsequently to the third step and, further, one or a plurality of cycles may be performed, each cycle consisting of four steps: a fifth step of supplying the first raw material gas, a sixth step of supplying the oxidation gas, a seventh step of supplying the second raw material gas or gas mixture of the first raw material gas and the second raw material gas, and an eighth step of supplying the oxidation gas.

Further, in the manufacturing method, the second raw material gas may be supplied simultaneously with the oxidation gas, or gas mixture of the first raw material gas and the second raw material gas may be supplied simultaneously with the oxidation gas, as the third step, and then one or a plurality of cycles each consisting of the first to third steps may be performed.

A second aspect of the present invention provides a semiconductor device manufacturing apparatus. The manufacturing apparatus includes a film formation chamber; a substrate holder provided within the film formation chamber so as to be capable of holding a substrate to be treated; a heater unit capable of adjusting temperature of the substrate holder; an oxidation gas supply source that introduces an oxidation gas into the film formation chamber; an oxidation gas supply unit having a first valve capable of controlling the supply of the oxidation gas and a first mass flow controller capable of controlling the flow rate thereof; a first gas supply source that introduces a first raw material gas containing Si into the film formation chamber; a first raw material gas supply unit having a second valve capable of controlling the supply of the first raw material gas and a second mass flow controller capable of controlling the flow rate thereof; a second gas supply source that introduces a second raw material gas containing a metal element M into the film formation chamber; a second raw material gas supply unit having a third valve capable of controlling the supply of the second raw material gas and a third mass flow controller capable of controlling the flow rate thereof; and a conductance valve capable of controlling the pressure in the film formation chamber. The manufacturing apparatus is particularly characterized by having a control device for controlling the first to third valves, the first to third mass flow controllers, and the conductance valve such that a first step of supplying the oxidation gas onto the substrate to be treated, a second step of supplying the first raw material gas onto the substrate to be treated, and a third step of supplying a gas containing the second raw material gas onto the substrate to be treated are performed sequentially.

BEST MODE FOR CARRYING OUT THE INVENTION

First Embodiment

Figure 2:
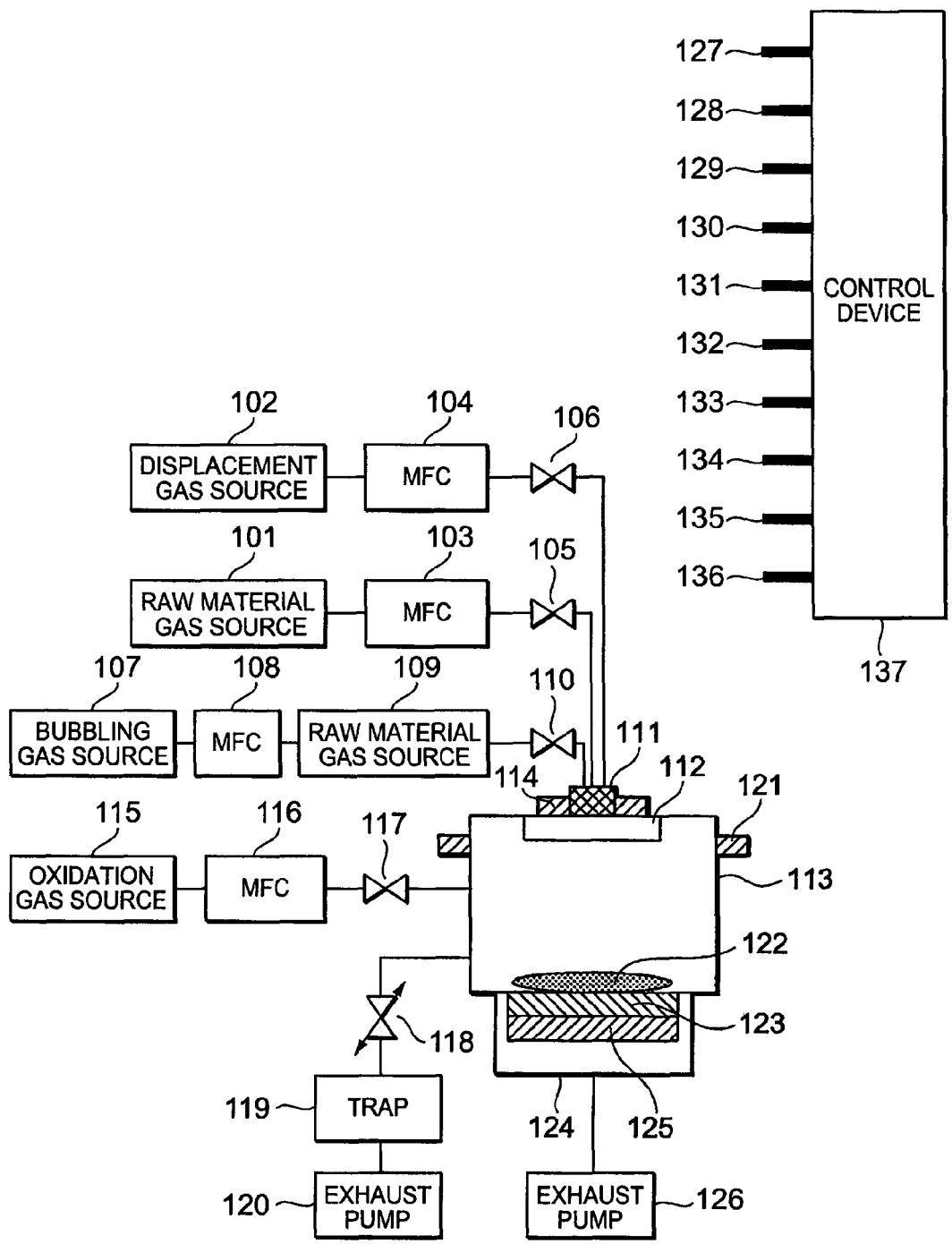
FIG. 2 is a block diagram schematically showing a first example of a film formation apparatus used in the present invention.

FIG. 2 shows schematic configuration of a first example of a film formation apparatus which is used when a gas supply method of supplying raw material gas and oxidation gas onto a substrate to be treated from above is employed in the present invention.

In FIG. 2, a film formation chamber 113 is designed to be heated to a predetermined temperature by means of a heater 121. The inner walls of the film formation chamber 113 are preferably set to a temperature which is higher than a temperature at which the raw material gas has a sufficient vapor pressure and lower than a decomposition temperature of the raw material gas. A first raw material gas is fed from a raw material gas source 101 to a mass flow controller (MFC) 103 (second mass flow controller), by which the flow rate thereof is adjusted to a predetermined flow rate, and is introduced into the film formation chamber 113 via a valve 105 (second valve). Additionally, bubbling gas is fed from a bubbling gas source 107 to a mass flow controller 108 (third mass flow controller), by which the flow rate thereof is adjusted to a predetermined flow rate. By means of this bubbling gas, a raw material gas from a raw material gas source 109 is introduced as a second raw material gas into the film formation chamber 113 via a valve 110 (third valve). Oxidation gas is fed from an oxidation gas source 115 to a mass flow controller 116 (first mass flow controller), by which the flow rate thereof is adjusted to a predetermined flow rate, and is introduced into the film formation chamber 113 via a valve 117 (first valve).

The first raw material gas and the second raw material gas are supplied onto a substrate to be treated 122 from above through a gas mixer 111 and a shower head 112, and are discharged through a conductance valve 118. The film formation pressure is controlled by means of opening of the conductance valve 118. The gas mixer 111 and the shower head 112 are designed to be able to be heated to a predetermined temperature by a heater 114. The inner walls of the gas mixer 111 and shower head 112 are preferably set to a temperature which is higher than a temperature at which the raw material gas has a sufficient vapor pressure and lower than a decomposition temperature of the raw material gas.

The substrate to be treated 122 is heated to a predetermined temperature via a susceptor 123 (substrate holder) by a heater 125. The gas supplied onto the substrate to be treated 122 is discharged through the conductance valve 118 and a trap 119 by an exhaust pump 120. A heater chamber 124 is evacuated by an exhaust pump 126. When no raw material gas or oxidation gas has been introduced into the film formation chamber 113, a displacement gas may be fed from a displacement gas source 102 to a mass flow controller 104, by which the flow rate thereof is adjusted, and may be introduced into the film formation chamber 113 via a valve 106. The introduced displacement gas is discharged through the conductance valve 118.

The displacement gas may be introduced into the film formation chamber 113 as a carrier gas together with the raw material gas or the oxidation gas.

Although, in FIG. 2, the first raw material gas is supplied after flow rate adjustment by the mass flow controller 103 and the second raw material gas is supplied by means of the bubbling gas the flow rate of which is adjusted by the mass flow controller 108, the present invention is not limited to this, and any other supply method may be selected as required. A carburetor may be provided between the mass flow controller 103 and the valve 105 and between the mass flow controller 108 and the valve 110. The opening/closing control of the valves 105, 106, 110, 117 is performed by a control device 137 via respective control input/output ports 127, 128, 129, 130. Flow rate adjustment by the mass flow controllers 103, 104, 108, 116 is controlled by the control device 137 via respective control input/output ports 131, 132, 133, 134. The opening adjustment of the conductance valve 118 is performed by the control device 137 via a control input/output port 135. The temperature of the heater 125 is adjusted by the control device 137 via an input/output port 136.

Figure 3:
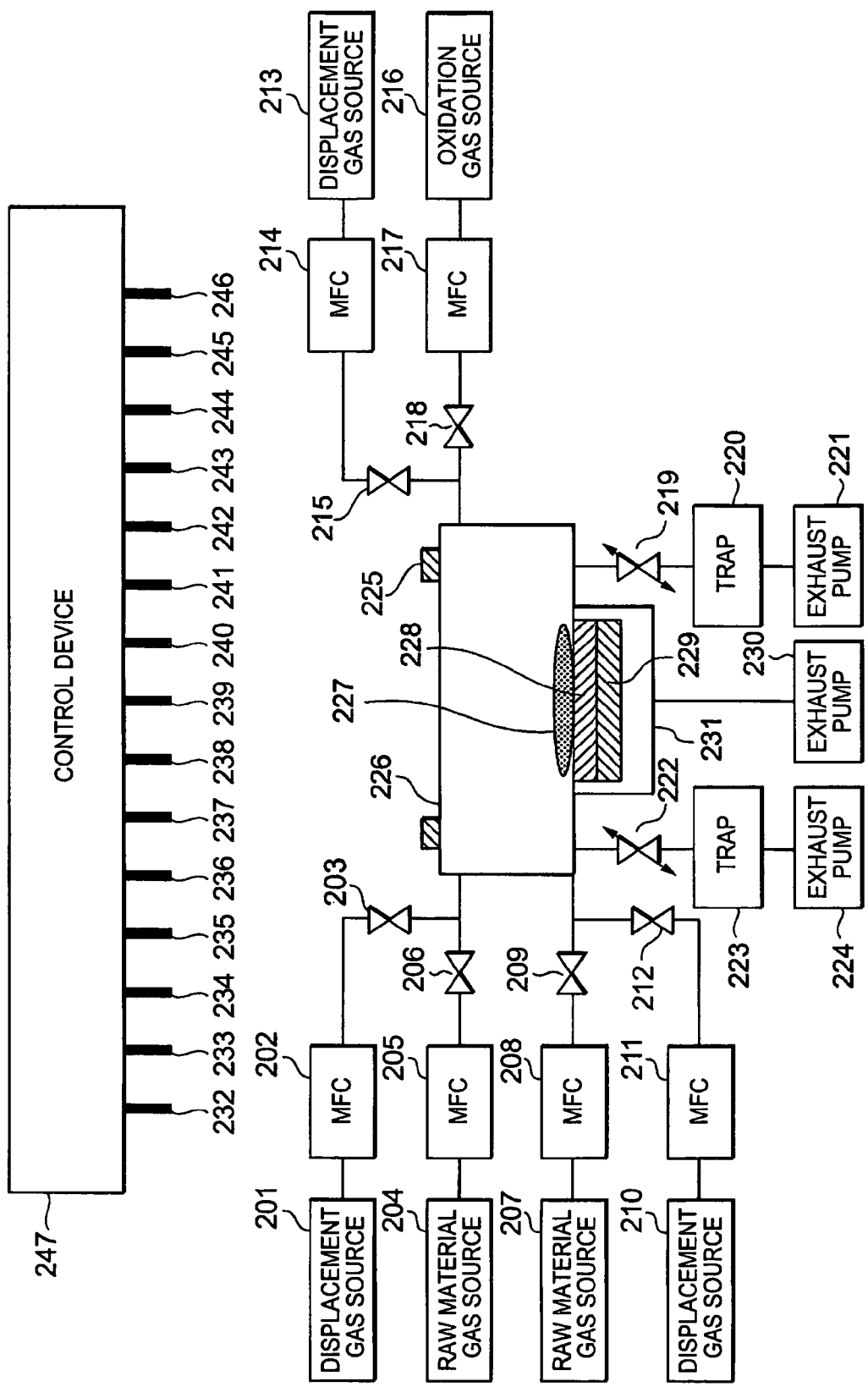
FIG. 3 is a block diagram schematically showing a second example of a film formation apparatus used in the present invention.

FIG. 3 shows schematic configuration of a second example of a film formation apparatus which is used when a gas supply method of supplying raw material gas and oxidation gas along the surface of a substrate to be treated is employed in the present invention. The film formation apparatus shown in FIG. 3 differs from the film formation apparatus shown in FIG. 2 in that the first raw material gas, the second raw material gas, and the displacement gas are introduced into the film formation chamber without involving a gas mixer or a shower head, and is discharged along the surface of the substrate to be treated.

In FIG. 3, a first raw material gas is fed from a raw material gas source 204 to a mass flow controller 205 (second mass flow controller) by which the flow rate thereof is adjusted, and is introduced into a film formation chamber 226 via a valve 206 (second valve). A second raw material gas is fed from a raw material gas source 207 to a mass flow controller 208 (third mass flow controller), by which the flow rate thereof is adjusted, and is introduced into the film formation chamber 226 via a valve 209 (third valve). An oxidation gas is fed from an oxidation gas source 216 to a mass flow controller 217 (first mass flow controller), by which the flow rate thereof is adjusted, and is introduced into the film formation chamber 226 via a valve 218 (first valve).

When the first raw material gas, the second raw material gas, or gas mixture of the first raw material gas and second raw material gas is introduced into the film formation chamber 226, the opening of a conductance valve 222 is reduced while the opening of a conductance valve 219 is increased. This causes the oxidation gas to be supplied along the surface of the substrate to be treated 227 and discharged from the side of the conductance valve 219 via a trap 220 and an exhaust pump 221. When the oxidation gas is introduced into the film formation chamber 226, the opening of the conductance valve 219 is reduced, while the opening of the conductance valve 222 is increased. This causes the oxidation gas to be supplied along the surface of the substrate to be treated 227, and discharged from the side of the conductance valve 222 via a trap 223 and an exhaust pump 224. When no raw material gas or oxidation gas is introduced into the film formation chamber 226, a displacement gas may be fed from displacement gas sources 201, 210, 213 to respective mass flow controllers 202, 211, 214, by which the flow rate thereof is adjusted, and introduced into the film formation chamber 226 via respective valves 203, 212, 215. The introduced displacement gas is discharged from conductance valves 222, 219. The opening of each of the conductance valves 222, 219 is set large. The displacement gas may be introduced into the film formation chamber 226 together with the raw material gas or the oxidation gas, as a carrier gas for the raw material gas or the oxidation gas.

The substrate to be treated 227 is heated to a predetermined temperature through a susceptor 228 (substrate holder) by a heater 229. A heater chamber 213 is evacuated by an exhaust pump 230. The method of supplying the raw material gases is not limited to this, but it may be supplied by using the bubbling described in FIG. 2. A carburetor may be provided between the mass flow controller 205 and the valve 206 and between the mass flow controller 208 and the valve 209. The opening/closing control of the valves 203, 206, 209, 212, 215, 218 is performed by a control device 247 via respective control input/output ports 232, 233, 234, 235, 236, 237. Flow rate adjustment by the mass flow controllers 202, 205, 208, 211, 214, 217 is controlled by the control device 247 via respective control input/output ports 238, 239, 240, 241, 242, 243. The opening adjustment of the conductance valves 219, 222 is performed by the control device 247 via respective control input/output ports 244, 245. The temperature of the heater 229 is adjusted by the control device 247 via an input/output port 246.

According to the present invention, when the raw material gases and the oxidation gas are supplied independently, a saturated adsorption mechanism will act for the raw material gas or the like on the substrate to be treated, and thus favorable uniformity in the deposition density can be achieved by using either of the film formation apparatuses shown in FIGS. 2 and 3. In contrast, when the raw material gas and the oxidation gas are supplied simultaneously onto the substrate to be treated, the film is formed by a CVD method. Therefore, it is preferable, in view of in-plane uniformity, to use the film formation apparatus shown in FIG. 2 having a gas mixer and a shower head mechanism.

Figure 1:
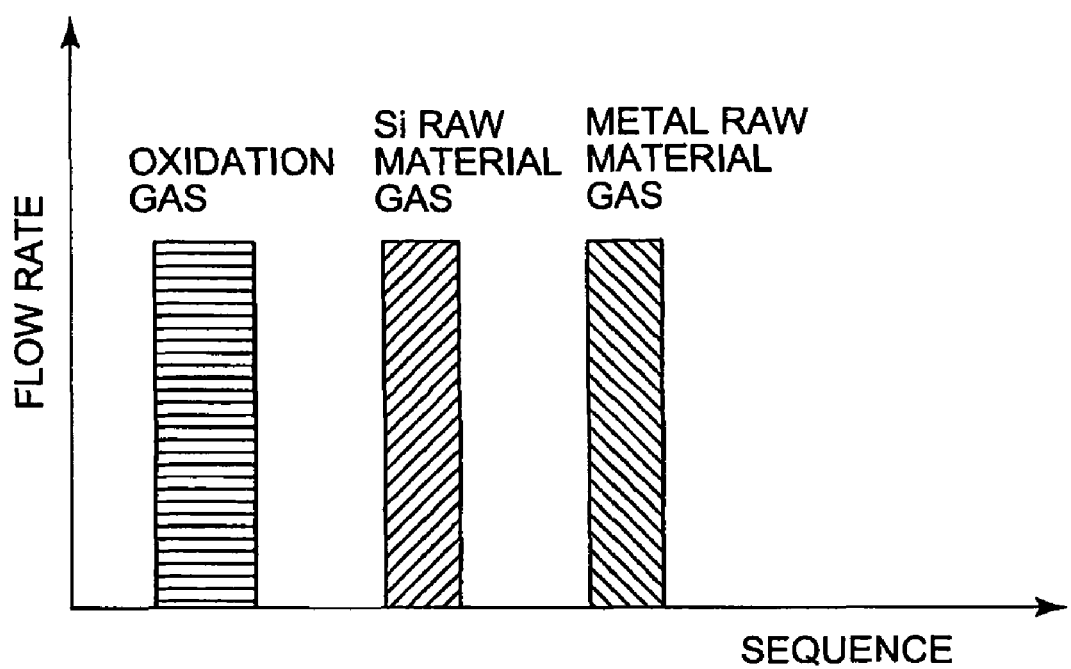
FIG. 1 is a sequence diagram showing a process of supplying raw material gases and an oxidation gas according a first embodiment of the present invention.

FIG. 1 is a sequence diagram showing a gas supplying process of a film formation method according to a first embodiment of the present invention. In the first embodiment, a first step of supplying an oxidation gas onto the substrate to be treated, a second step of supplying a Si raw material gas as the first raw material gas, and a third step of supplying a metal raw material gas as the second raw material gas are carried out sequentially. In the third step, gas mixture of the first raw material gas and the second raw material gas may be supplied. Further, in FIG. 1, a step of displacing the oxidation gas or the raw material gas with a displacement gas may be added between the first step and the second step, or between the second step and the third step.

The semiconductor device manufacturing method of the present invention is characterized by a method of forming a metal oxide film consisting of a metal element M and Si on a substrate to be treated containing at least Si as a constituent element, by using a first raw material gas containing Si, a second raw material gas containing the metal element M, and an oxidation gas.

The film formation method according to the present invention is particularly based on a principle discovered by the present inventor as described below. In the case in which the first step of supplying the oxidation gas onto the substrate to be treated and the second step of supplying the first raw material gas onto the substrate to be treated are carried out sequentially, and then a step of supplying the second raw material gas or gas mixture of the second raw material gas and first raw material gas is carried out without involving the supply process of the oxidation gas, the supply amount of the first raw material gas and the partial supply pressure of the first raw material gas in the second step are adjusted. This makes it possible to control the deposition density of the metal element M supplied after the second step and deposited on the substrate to be treated, whereby the effect of the surface state of the substrate to be treated can be suppressed and the variation in deposition density of the metal element due to incubation time can be suppressed.

Figure 4:
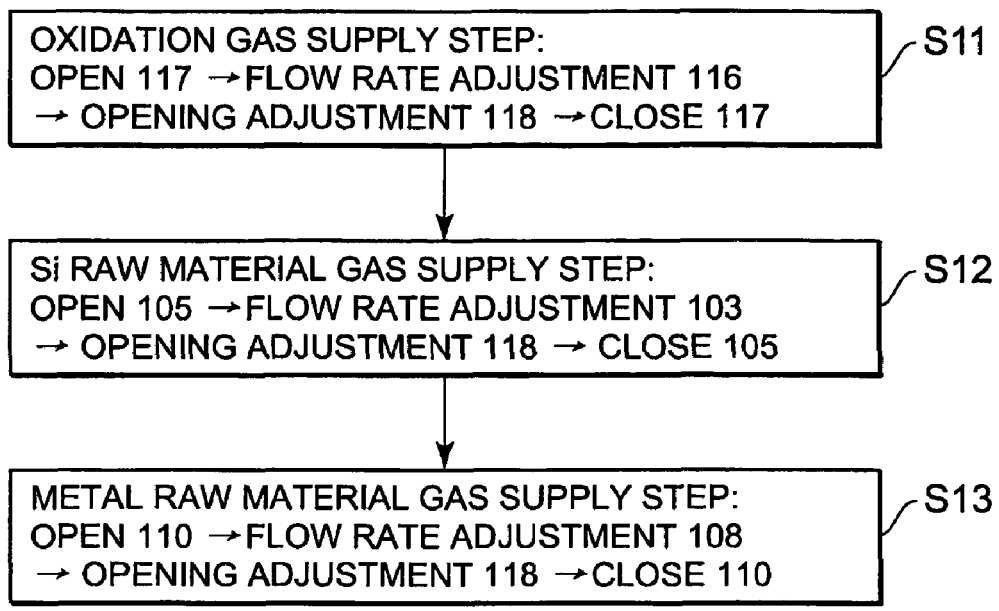
FIG. 4 is a flowchart showing a control process when the first embodiment of the present invention is applied to the film formation apparatus shown in FIG. 2.

When the gas supply sequence shown in FIG. 1 is carried out by using the film formation apparatus shown in FIG. 2, it is preferable to use a control process shown in FIG. 4.

Referring to FIG. 4, in an oxidation gas supply step of step S11, the valve 117 is opened, the flow rate of the oxidation gas is adjusted by the mass flow controller 116, the opening of the conductance valve 118 is adjusted, and then valve 117 is closed. Subsequently, in a Si raw material gas supply step of step S12, the valve 105 is opened, the flow rate of the Si raw material gas is adjusted by the mass flow controller 103, the opening of the conductance valve 118 is adjusted, and then the valve 105 is closed. Subsequently, in a metal raw material gas supply step of step S13, the valve 110 is opened, the flow rate of the bubbling gas is adjusted by the mass flow controller 108, the opening of the conductance valve 118 is adjusted, and then the valve 110 is closed.

Although only the metal raw material gas is supplied in the step S13 in the control process shown in FIG. 4, gas mixture of the metal raw material gas and the Si raw material gas may be supplied. In that case, in step S13, an open operation of the valves 105 and 110, adjustment of the flow rate by the mass flow controllers 103 and 10, adjustment of the opening of the conductance valve 118, and a close operation of the valves 105 and 110 are performed sequentially. Further, a displacement gas (inert gas) may be supplied at the same time with the oxidation gas and the raw material gas in the gas supply steps of steps S11 to S13. In that case, control operations consisting of open operation of the valve 106 and adjustment of the flow rate of the displacement gas by the mass flow controller 104 may be added in each gas supply step. Further, a step of displacing the oxidation gas or the raw material gas may be set between the gas supply steps in FIG. 4. In that case, the valve 106 is opened after closing of the valve 117 or valve 105, the flow rate of the displacement gas from the displacement gas source 102 is adjusted by the mass flow controller 104, and then the conductance valve 118 is adjusted so that the displacement gas is introduced into the film formation chamber 113.

Figure 5:
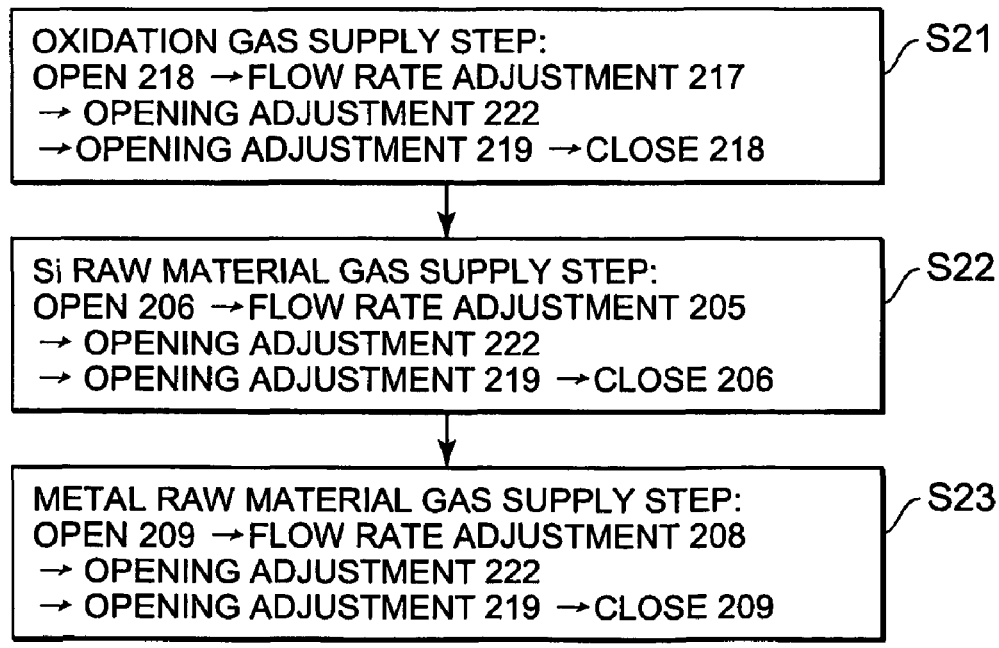
FIG. 5 is a flowchart showing a control process when the first embodiment of the present invention is applied to the film formation apparatus shown in FIG. 3.

In order to carry out the gas supply sequence shown in FIG. 1 by using the film formation apparatus shown in FIG. 3, it is preferable to use a control process shown in FIG. 5.

Referring to FIG. 5, in an oxidation gas supply step of step S21, the valve 218 is opened, the flow rate of the oxidation gas is adjusted by the mass flow controller 217, the opening of the conductance valves 222 and 219 is adjusted, and then the valve 218 is closed. Subsequently, in a Si raw material gas supply step of step S22, the valve 206 is opened, the flow rate of the Si raw material gas is adjusted by the mass flow controller 205, the opening of the conductance valves 222 and 219 is adjusted, and then the valve 206 is closed. Subsequently, in a metal raw material gas supply step in step S23, the valve 209 is opened, the flow rate of the metal raw material gas is adjusted by the mass flow controller 208, the opening of the conductance valves 222 and 219 is adjusted, and then the valve 209 is closed.

Although only the metal raw material gas is supplied in step S23 in the control process shown in FIG. 5, gas mixture of the metal raw material gas and the Si raw material gas may be supplied. In that case, a series of control operations consisting of open operation of the valves 209 and 206, flow rate adjustment by the mass flow controllers 208 and 205, opening adjustment of the conductance valves 222 and 219, and close operation of the valves 209 and 206 are carried out. Further, a displacement gas (inert gas) may be supplied at the same time with the supply of the oxidation gas and the raw material gas in each of the gas supply steps of steps S21 to S23. In that case, there may be added, in each the gas supply steps, a series of control operations consisting of open operation of the valve 215, displacement gas flow rate adjustment by the mass flow controller 214 and close operation of the valve 215, or a series of control operations consisting of open operation of the valve 203, displacement gas flow rate adjustment by the mass flow controller 202, and close operation of the valve 203, or a series of control operations consisting of open operation of the valve 212, displacement gas flow rate adjustment by the mass flow controller 211, and close operation of the valve 212. Further, a step of displacing the oxidation gas or the raw material gas may be set after each of the gas supply steps of steps S21 to S23 in FIG. 5. In that case, the gas supply steps may be followed by a series of operations consisting of open operation of the valve 215, displacement gas flow rate adjustment by the mass flow controller 214 and close operation of the valve 215, or a series operations consisting of open operation of the valve 203, displacement gas flow rate adjustment by the mass flow controller 202 and close operation of the valve 203, or a series operations consisting of open operation of the valve 212, displacement gas flow rate adjustment by the mass flow controller 211, and close operation of the valve 212, and the opening adjustment of the conductance valves 222 and 219 is additionally performed so that the displacement gas from the displacement gas source 213, 201, or 210 is introduced into the film formation chamber 226.

A description will be made of a mechanism for deposition of a metal element M in the film formation method according to the present invention. FIGS. 6A to 6D show an example of the deposition mechanism when the metal element M is Hf, and illustrate the Hf deposition states on the surface of a substrate to be treated in the respective processes: an oxidation gas supply process, a Si raw material supply process, and a supply process of gas mixture of the Hf raw material and the Si raw material.

Figure 6A:
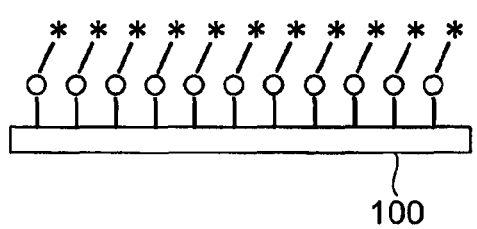
FIGS. 6A to 6D are diagrams for explaining the concept of a film formation mechanism in a film formation method according to the present invention.

FIG. 6A shows an adsorption site formation process, in which oxygen adsorption sites are formed on the surface of the substrate to be treated 100 by supplying the oxidation gas.

Figure 6B:
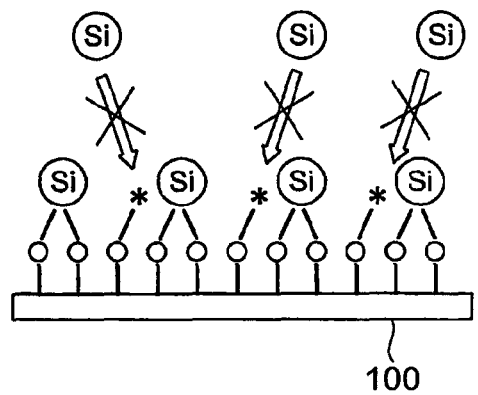

FIG. 6B shows the Si raw material supply process in which the Si raw material gas is supplied. The Si deposition density can be controlled by adjusting the supply amount and partial supply pressure of the Si raw material gas. Further, a deposition density suitable for the supply conditions of the Si raw material gas can be determined self-restrictively by optimizing the supply amount or the partial supply pressure of the Si raw material gas. This means that a growth termination mechanism works so that no more Si is deposited even if the Si raw material is supplied excessively. Since the Si deposit state thus can be controlled by the supply conditions of the Si raw material gas, the adsorption sites will remain according thereto.

Figure 6C:
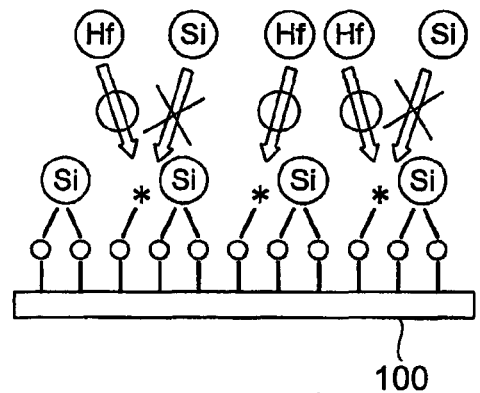
Figure 6D:
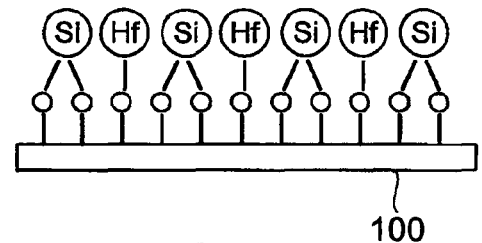

FIG. 6C shows the gas mixture supply process, in which when the gas mixture of the Hf raw material and the Si raw material is supplied, only Hf is deposited on the remaining adsorption sites. It is believed that this is because a different number of adsorption sites is required for adsorbing Hf from that for adsorbing Si. Accordingly, exactly the same state can be obtained even if only the Hf raw material is supplied. After that, the Hf deposition density is determined self-restrictively, and the growth terminates as shown in FIG. 6D. This means that, even if the Hf raw material is supplied excessively, the growth termination mechanism works so that no more Hf is deposited.

In the Si raw material supply process shown in FIG. 6B, only the first raw material gas is supplied, whereby Si is deposited also on the adsorption sites including dangling bonds which have been present on the substrate to be treated 100 prior to the supply of the oxidation gas. As a result, the Hf deposition state is not affected any more by the dangling bonds or the like which have been present on the substrate to be treated 100, and thus the variation in the Hf deposition density due to the surface state of the substrate to be treated 100 is suppressed. Furthermore, the incubation time inherent in the atomic layer adsorption/deposition method and the CVD method can be suppressed, and the linearity of the Hf deposition density to the number of cycles or the film formation time can be improved.

Second Embodiment

Figure 7:
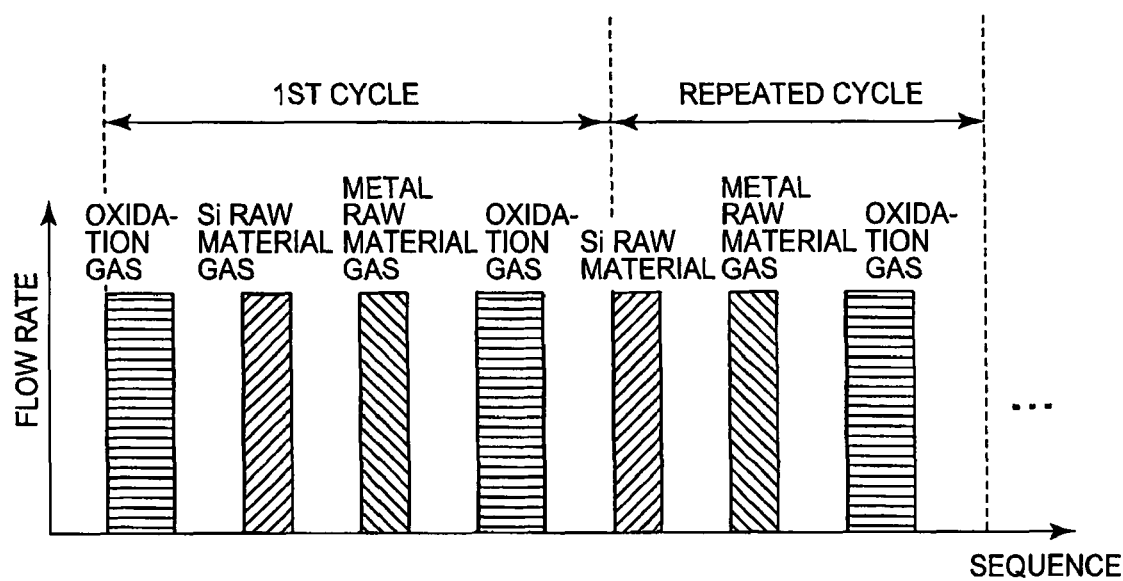
FIG. 7 is a sequence diagram showing a process for supplying raw material gases and an oxidation gas according to a second embodiment of the present invention.

FIG. 7 is a sequence diagram showing a gas supply process in a film formation method according to a second embodiment of the present invention. According to the second embodiment, a first step of supplying an oxidation gas onto a substrate to be treated, a second step of supplying Si raw material gas as a first raw material gas, a third step of supplying metal raw material gas as a second raw material gas, and a fourth step of supplying an oxidation gas are performed sequentially in the first cycle are sequentially performed as a first cycle. After the first cycle, a repeated cycle consisting of a fifth step of supplying the Si raw material gas, a sixth step of supplying the metal raw material gas, and a seventh step of supplying the oxidation gas is performed for a predetermined number of times. Alternatively, gas mixture of the first raw material gas and second raw material gas may be supplied in the third or sixth step. In the sequence shown in FIG. 7, a step may be set after each of steps for displacing the oxidation gas or the raw material gas with a displacement gas. The displacement gas may be introduced into the film formation chamber as a carrier gas together with the raw material gas or the oxidation gas.

Figure 8:
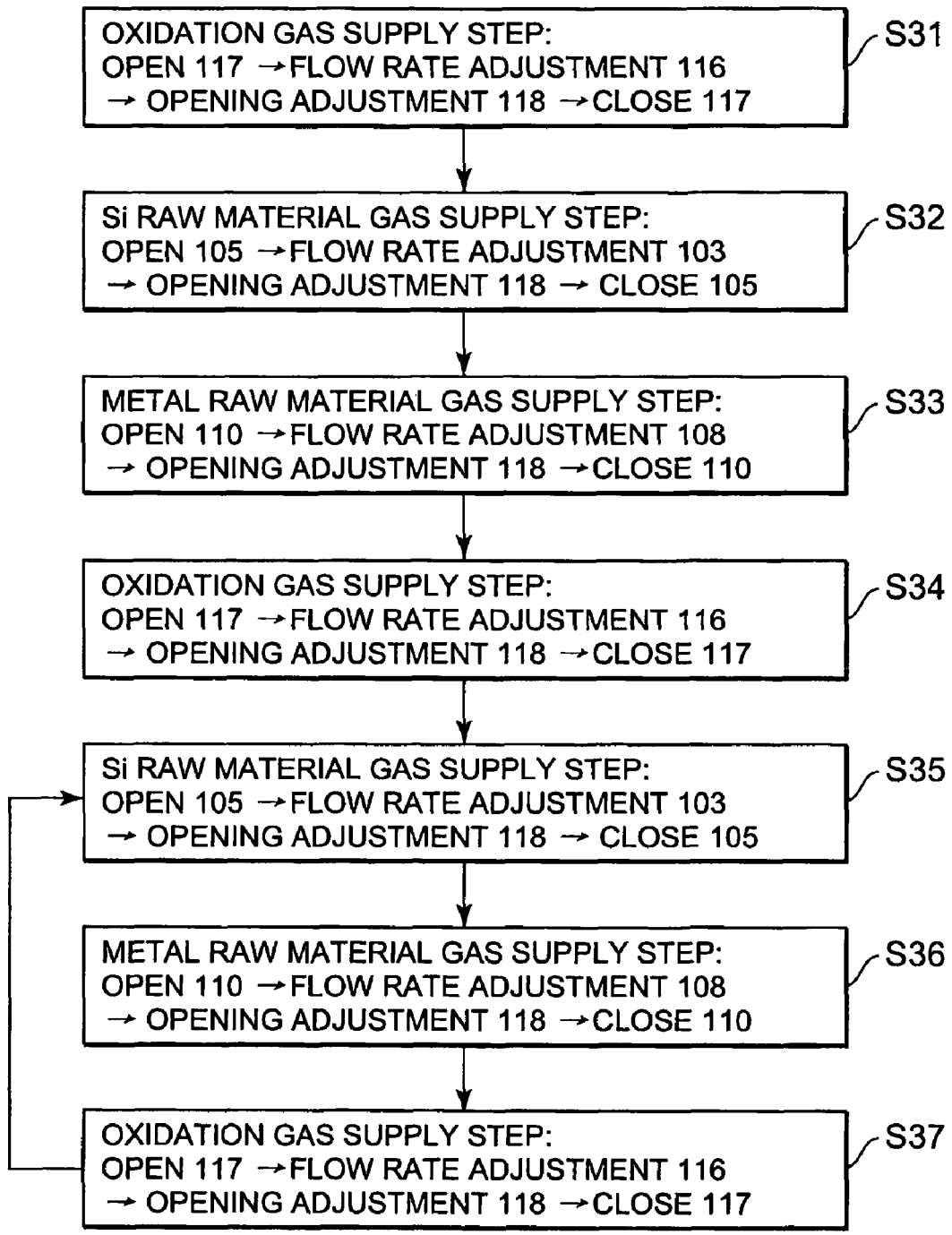
FIG. 8 is a flowchart showing a control process when the second embodiment of the present invention is applied to the film formation apparatus shown in FIG. 2.

It is preferable to use a control process shown in FIG. 8 when the gas supply sequence shown in FIG. 7 is performed by using the film formation apparatus shown in FIG. 2.

Referring to FIG. 8, in an oxidation gas supply step of step S31, the valve 117 is opened, the flow rate of the oxidation gas is adjusted by the mass flow controller 116, the opening of the conductance valve 118 is adjusted, and then the valve 117 is closed. Subsequently, in a Si raw material gas supply step of step S32, the valve 105 is opened, the flow rate of the Si raw material gas is adjusted by the mass flow controller 103, the opening of the conductance valve 118 is adjusted, and then the valve 105 is closed. Subsequently, in a metal raw material gas supply step of step S33, the valve 110 is opened, the flow rate of the bubbling gas is adjusted by the mass flow controller 108, the opening of the conductance valve 118 is adjusted, and then the valve 110 is closed. Subsequently, in an oxidation gas supply step of step S34, the valve 117 is opened, the flow rate of the oxidation gas is adjusted by the mass flow controller 116, the opening of the conductance valve 118 is adjusted, and then the valve 117 is closed. The steps S35 to S37 are the same as those of steps S32 to step S34, and steps S35 to step S37 are repeated until reaching a necessary number of cycles.

Although only the metal raw material gas is supplied in the steps S33 and S36 in the control process shown in FIG. 8, gas mixture of the metal raw material gas and the Si raw material gas may be supplied. In that case, a series of control operations consisting of open operation of the valves 105 and 110, flow rate adjustment by the mass flow controllers 103 and 108, opening adjustment of the conductance valve 118 and close operation of the valves 105 and 110 are carried out in the step S33 and step S36.

Further, in each of the gas supply steps in the steps S31 to S37, a displacement gas (inert gas) may be supplied at the same time with the oxidation gas or the raw material gas. In that case, a series of control operations may be added in each of the gas supply steps, consisting of open operation of the valve 106, flow rate adjustment of the displacement gas (inert gas) by the mass flow controller 104, and close operation of the valve 106. Alternatively, a step of displacing the oxidation gas or the raw material gas may be set after each of the gas supply steps in FIG. 8. In this case, the displacement gas from the displacement gas source 102 may be introduced into the film formation chamber 113 by opening the valve 106 after the close operation of the valve 117, the valve 105 or the valve 110, adjusting flow rate by means of the mass flow controller 104, and adjusting the conductance valve 118.

Figure 9:
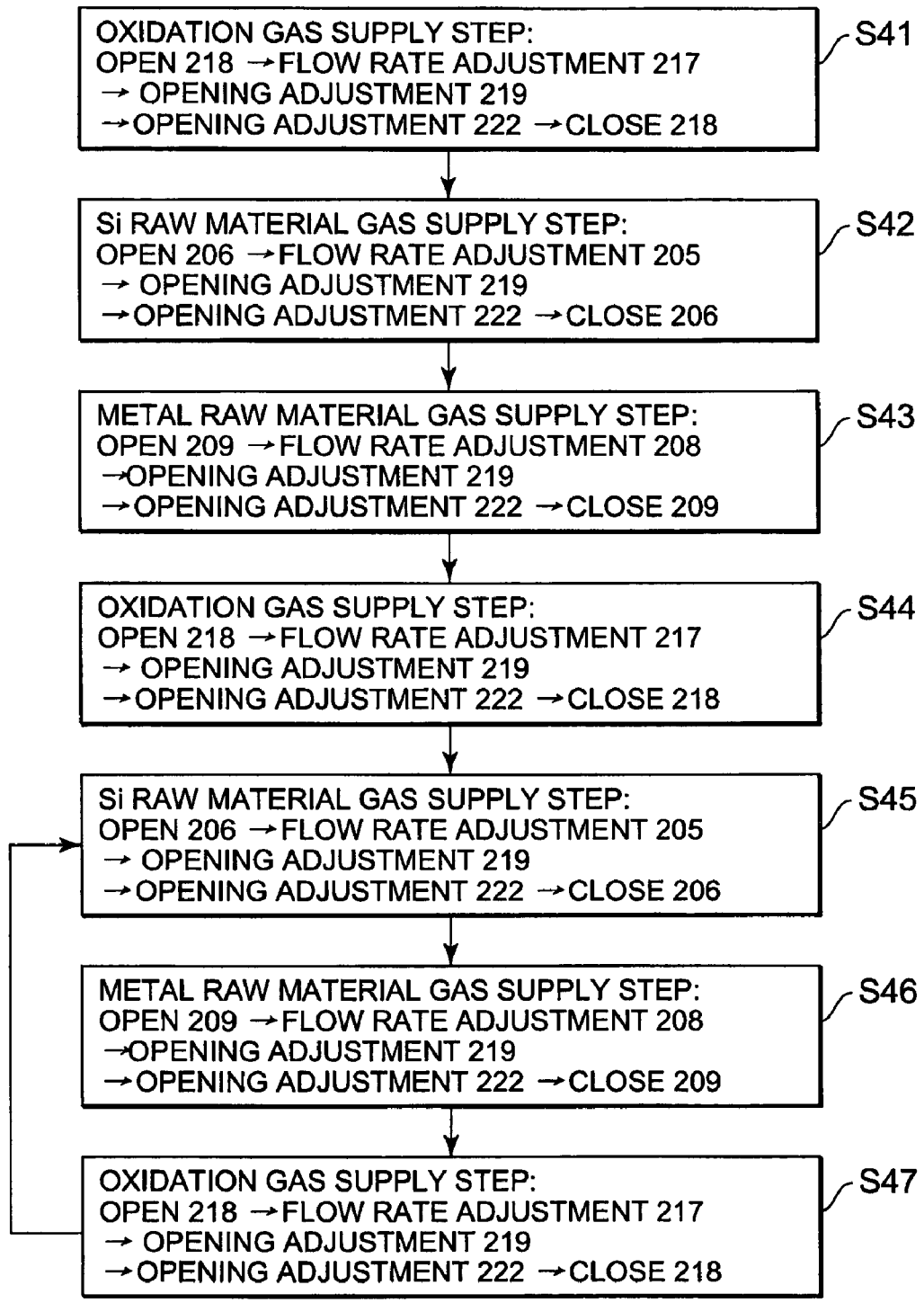
FIG. 9 is a flowchart showing a control process when the second embodiment of the present invention is applied to the film formation apparatus shown in FIG. 3.

On the other hand, it is preferable to use a control process shown in FIG. 9 when the gas supply sequence shown in FIG. 7 is performed by using the film formation apparatus shown in FIG. 3.

Referring to FIG. 9, in an oxidation gas supply step of step S41, the valve 218 is opened, the oxidation gas flow rate is adjusted by the mass flow controller 21, the opening of the conductance valves 222 and 219 is adjusted, and then valve 218 is closed. Subsequently, in a Si raw material gas supply step of step S42, the valve 206 is opened, the Si raw material gas flow rate was adjusted by the mass flow controller 205, the opening of the conductance valves 222 and 219 is adjusted, and then the valve 206 is closed. Subsequently, in a metal raw material gas supply step of step S43, the valve 209 is opened, the metal raw material gas flow rate is adjusted by the mass flow controller 208, the opening of the conductance valves 222 and 219 is adjusted, and then the valve 209 is closed. Subsequently, in an oxidation gas supply step of step S44, the valve 218 is opened, the oxidation gas flow rate is adjusted by the mass flow controller 217, the opening of the conductance valves 222 and 219 is adjusted, and then the valve 218 is closed. The steps S45 to step S47 are the same as those of steps S42 to step S44, and the step S45 to step S47 are repeated until reaching a necessary number of cycles.

Although only the metal raw material gas is supplied in the steps S43 and S46 in the control process shown in FIG. 9, gas mixture of the metal raw material gas and the Si raw material gas may be supplied. In that case, a series of control operations are carried out, consisting of open operation of the valves 209 and 206, flow rate adjustment by the mass flow controllers 208 and 205, adjustment of the opening of the conductance valves 222 and 219, and close operation of the valves 209 and 206. Further, in the gas supply steps of steps S41 to S47, an inert gas may be supplied at the same time with the oxidation gas or the raw material gas. In that case, a series of control operations may be added in each of the gas supply steps, the control operations consisting of open operation of the valve 215, displacement gas flow rate adjustment by the mass flow controller 214, and close operation of the valve 215, or consisting of open operation of the valve 203, displacement gas flow rate adjustment by the mass flow controller 202, and close operation of the valve 203, or consisting of open operation of the valve 212, displacement gas flow rate adjustment by the mass flow controller 211, and close operation of the valve 212. A step of displacing the oxidation gas or the raw material gas may be set after each of the gas supply steps of steps S41 to S47 in FIG. 9. In that case, the displacement gas from the displacement gas source 213, 201, or 210 may be introduced into the film formation chamber 226, by performing after each of the gas supply steps, a series of operations consisting of open operation of the valve 215, displacement gas flow rate adjustment by the mass flow controller 214, and close operation of the valve 215, or of open operation of the valve 203, displacement gas flow rate adjustment by the mass flow controller 202 and close operation of the valve 203, or of open operation of the valve 212, displacement gas flow rate adjustment by the mass flow controller 211, and close operation of the valve 212, while at the same time adjusting the opening of the conductance valves 222 and 219.

Third Embodiment

Figure 10:
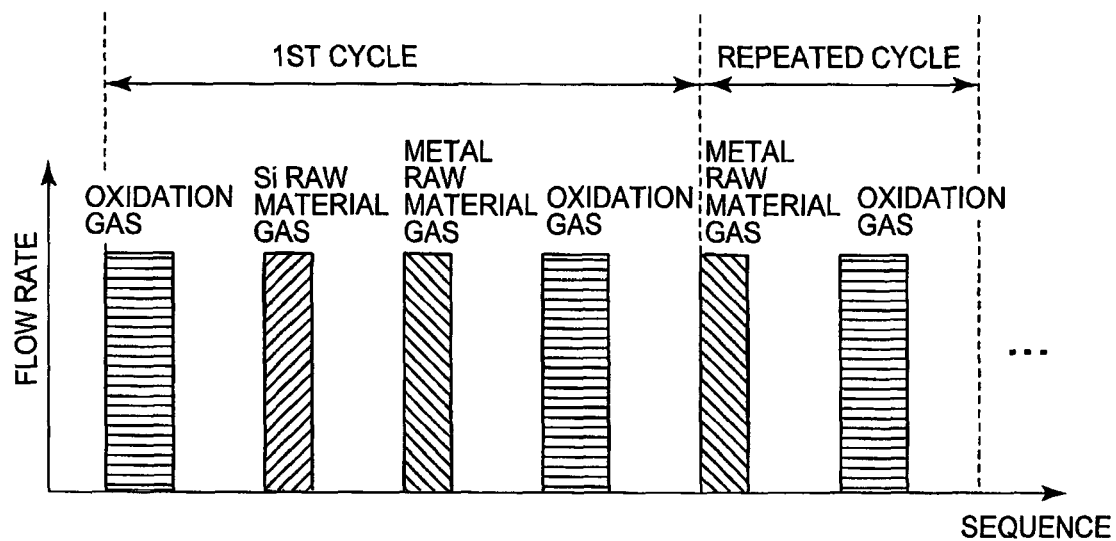
FIG. 10 is a sequence diagram showing a process for supplying raw material gases and an oxidation gas according to a third embodiment of the present invention.

FIG. 10 is a sequence diagram showing a gas supply process of a film formation method according to a third embodiment of the present invention. According to the third embodiment, a first step of supplying an oxidation gas onto the substrate to be treated, a second step of supplying a Si raw material gas as a first raw material gas, a third step of supplying a metal raw material gas as a second raw material gas, and a fourth step of supplying the oxidation gas are performed sequentially as a first cycle. After the first cycle, a repeated cycle consisting of a fifth step of supplying the metal raw material gas and a sixth step of supplying the oxidation gas is repeated for a predetermined times. In the sequence shown in FIG. 10, gas mixture of the first raw material gas and the second raw material gas may be supplied in the third and fifth steps. Further, a step of displacing the oxidation gas or the raw material gas with a displacement gas may be set after each of steps. Further, the displacement gas may be introduced into the film formation chamber as a carrier gas, together with the raw material gas or the oxidation gas.

Figure 11:
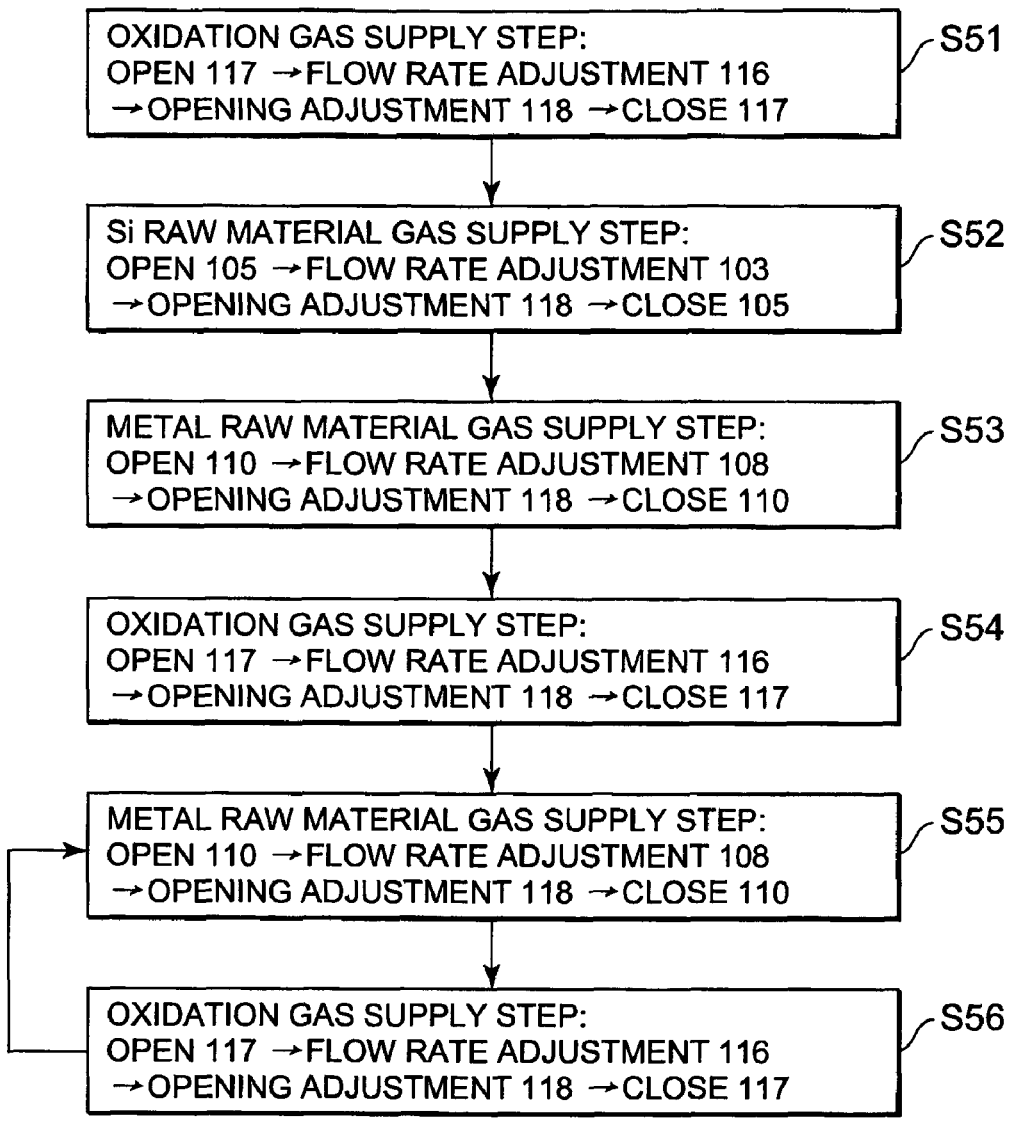
FIG. 11 is a flowchart showing a control process when the third embodiment of the present invention is applied to the film formation apparatus shown in FIG. 2.

In order to carry out the gas supply sequence shown in FIG. 10 by using the film formation apparatus shown in FIG. 2, it is preferable to use a control process shown in FIG. 11.

Referring to FIG. 11, in an oxidation gas supply step of step S51, the valve 117 is opened, the oxidation gas flow rate is adjusted by the mass flow controller 116, the opening of the conductance valve 118 is adjusted, and then the valve 117 is closed. Subsequently, in a Si raw material gas supply step of step S52, the valve 105 is opened, the Si raw material gas flow rate is adjusted by the mass flow controller 103, the opening of the conductance valve 118 is adjusted, and then the valve 105 is closed. Subsequently, in a metal raw material gas supply step of step S53, the valve 110 is opened, the bubbling gas flow rate is adjusted by the mass flow controller 108, the opening of the conductance valve 118 is adjusted, and then the valve 110 is closed. Subsequently, in an oxidation gas supply step of step S54, the valve 117 is opened, the oxidation gas flow rate is adjusted by the mass flow controller 116, the opening of the conductance valve 118 is adjusted, and then the valve 117 is closed. The steps S55 to S56 are the same as those of the steps S53 to S54, and the steps S55 and S56 are repeated until reaching a required number of cycles.

Although only the metal raw material gas is supplied in the steps S53 and S55 in the control process shown in FIG. 11, gas mixture of the metal raw material gas and the Si raw material gas may be supplied. In that case, a series of control operations are performed in S53 or S55, consisting of open operation of the valves 105 and the valve 110, flow rate adjustment by the mass flow controller 103 and the mass flow controller 108, opening adjustment for the conductance valve 118, and close operation of the valve 105 and the valve 110.

Further, a displacement gas (inert gas) may be supplied in each of the gas supply steps of steps S51 to S56, at the same time with the oxidation gas or the raw material gas. In that case, a series of control operations consisting of open operation of the valve 106, flow rate adjustment for the displacement gas (inert gas) by the mass flow controller 104, and close operation of the valve 106 my be added in each of the gas supply steps. Further, a step of displacing the oxidation gas or the raw material gas may be set after each of the gas supply steps in FIG. 11. In that case, the displacement gas from the displacement gas source 102 may be introduced into the film formation chamber 113 by opening the valve 106 after closing of the valve 117, the valve 105 or the valve 110, adjusting the displacement gas flow rate by mass flow controller 104, and adjusting the conductance valve 118.

Figure 12:
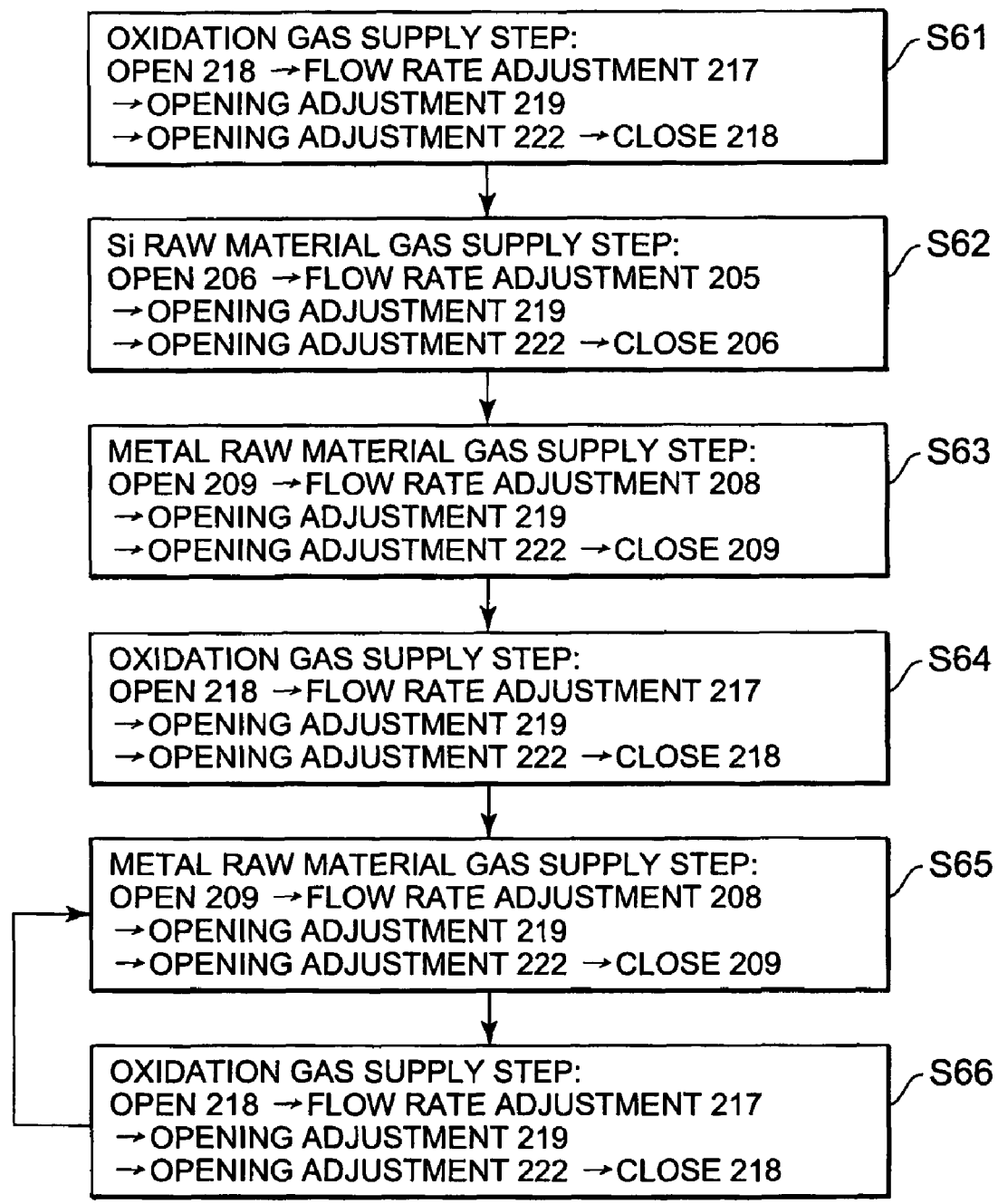
FIG. 12 is a flowchart showing a control process when the third embodiment of the present invention is applied to the film formation apparatus shown in FIG. 3.

On the other hand, it is preferable to use a control process shown in FIG. 12 in order to carry out the gas supply sequence shown in FIG. 10 by using the film formation apparatus shown in FIG. 3.

Referring to FIG. 12, in an oxidation gas supply step of step S61, the valve 218 is opened, the oxidation gas flow rate is adjusted by the mass flow controller 217, the opening of the conductance valves 222 and 219 is adjusted, and then the valve 218 is closed. Subsequently, in a Si raw material gas supply step of step S62, the valve 206 is opened, the Si raw material gas flow rate is adjusted by the mass flow controller 205, the opening of the conductance valves 222 and 219 is adjusted, and then the valve 206 is closed. Subsequently, in a metal raw material gas supply step of step S63, the valve 209 is opened, the metal raw material gas flow rate is adjusted by the mass flow controller 208, the opening of the conductance valves 222 and 219 is adjusted, and then the valve 209 is closed. Subsequently, in an oxidation gas supply step of step S64, the valve 218 is opened, the oxidation gas flow rate is adjusted by the mass flow controller 217, the opening of the conductance valves 222 and 219 is adjusted, and then the valve 218 is closed. The steps S65 to S66 are the same as those of the steps S63 to S64, and the steps S65 to S66 are repeated until reaching a required number of cycles.

Although only the metal raw material gas is supplied in the steps S63 and S65 in the control process shown in FIG. 12, gas mixture of the metal raw material gas and the Si raw material gas may be supplied. In that case, a series of control operations are carried out, consisting of open operation of the valves 209 and 206, raw material gas flow rate adjustment by the mass flow controllers 208 and 205, opening adjustment for the conductance valves 222 and 219, and close operation of the valves 209 and 206. Further, a displacement gas (inert gas) may be supplied at the same time with the oxidation gas or the raw material gas in each of the gas supply steps of steps S61 to S66. In that case, a series of control operations may be added in each of the gas supply steps, the control operations consisting of open operation of the valve 215, displacement gas flow rate adjustment by the mass flow controller 214, and close operation of the valve 215, or consisting of open operation of the valve 203, displacement gas flow rate adjustment by the mass flow controller 202, and close operation of the valve 203, or consisting of open operation of the valve 212, displacement gas flow rate adjustment by the mass flow controller 211, and close operation of the valve 212. Further, a step of displacing the oxidation gas or the raw material gas may be set after each of the gas supply steps of steps S61 to S66 in FIG. 12. In that case, the displacement gas from the displacement gas source 213, 201, or 210 may be introduced into the film formation chamber 226 by performing, after each of the gas supply steps, a series of operations consisting of open operation of the valve 215, displacement gas flow rate adjustment by the mass flow controller 214, and close operation of the valve 215, or consisting of open operation of the valve 203, displacement gas flow rate adjustment by the mass flow controller 202, and close operation of the valve 203, or consisting of open operation of the valve 212, displacement gas flow rate adjustment by the mass flow controller 211, and close operation of the valve 212, while at the same time adjusting the opening of the conductance valves 222 and 219.

Fourth Embodiment

Figure 13:
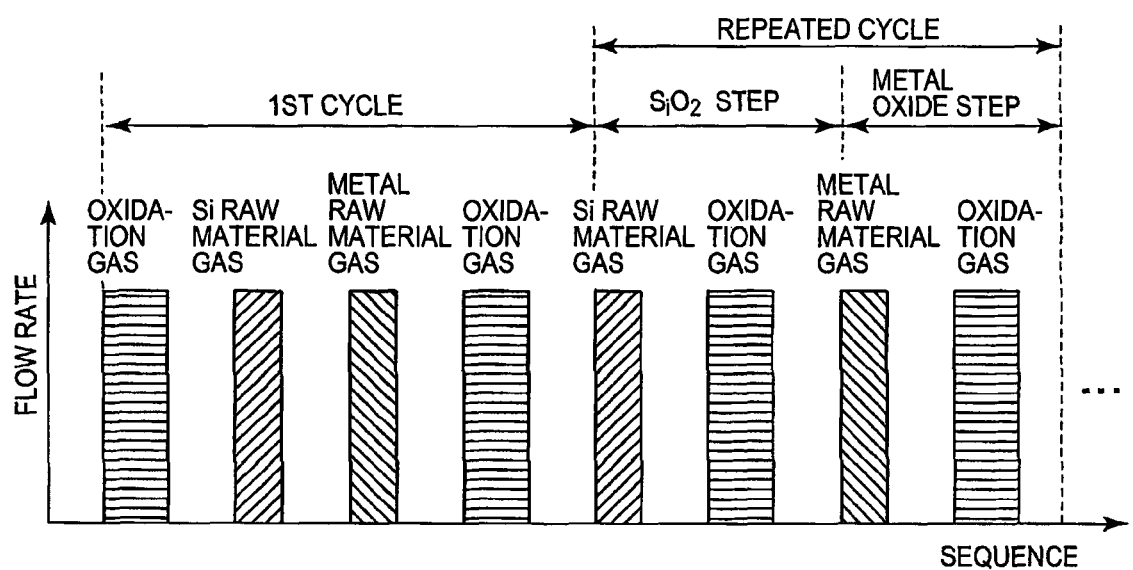
FIG. 13 is a sequence diagram showing a process for supplying raw material gases and an oxidation gas according to a fourth embodiment of the present invention.

FIG. 13 is a sequence diagram showing a gas supply process in a film formation method according to a fourth embodiment of the present invention. According to the fourth embodiment, a first step of supplying an oxidation gas onto the substrate to be treated, a second step of supplying a Si raw material gas as a first raw material gas, a third step of supplying a metal raw material gas as a second raw material gas, and a fourth step of supplying the oxidation gas are performed sequentially in this order as the first cycle. After that, a repeated cycle consisting of a fifth step of supplying the Si raw material gas, a sixth step of supplying the oxidation gas, a seventh step of supplying the metal raw material gas, and an eighth step of supplying the oxidation gas is performed for a predetermined number of times. In the sequence shown in FIG. 13, a step of displacing the oxidation gas or the raw material gas with a displacement gas may be set after each of steps. Further, the displacement gas may be introduced into the film formation chamber as a carrier gas together with the raw material gas or the oxidation gas.

Figure 14:
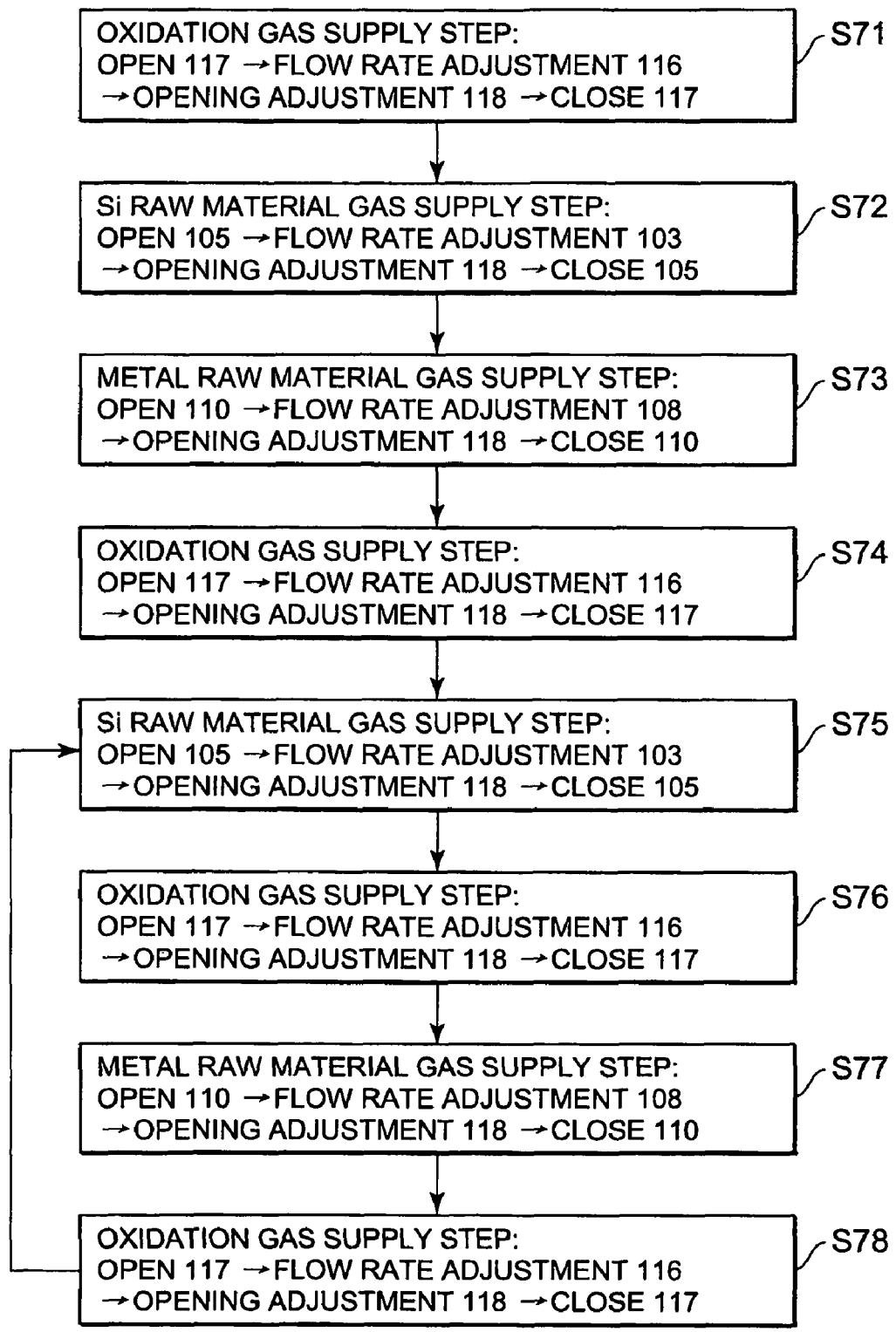
FIG. 14 is a flowchart showing a control process when the fourth embodiment of the present invention is applied to the film formation apparatus shown in FIG. 2.

In order to perform the gas supply sequence shown in FIG. 13 by using the film formation apparatus shown in FIG. 2, it is preferable to use a control process shown in FIG. 14.

Referring to FIG. 14, in an oxidation gas supply step of step S71, the valve 117 is opened, the oxidation gas flow rate is adjusted by the mass flow controller 116, the opening of the conductance valve 118 is adjusted, and then the valve 117 is closed. Subsequently, in a Si raw material gas supply step of step S72, the valve 105 is opened, the Si raw material gas flow rate is adjusted by the mass flow controller 103, the opening of the conductance valve 118 is adjusted and then the valve 105 is closed. Subsequently, in a metal raw material gas supply step of step S73, the valve 110 is opened, the bubbling gas flow rate is adjusted by the mass flow controller 108, the opening of the conductance valve 118 is adjusted, and then the valve 110 is closed. Subsequently, in an oxidation gas supply step of step S74, the valve 117 is opened, the oxidation gas flow rate is adjusted by the mass flow controller 116, the opening of the conductance valve 118 is adjusted, and the valve 117 is closed. Subsequently, in a Si raw material gas supply step of step S75, the valve 105 is opened, the Si raw material gas flow rate is adjusted by the mass flow controller 103, the opening of the conductance valve 118 is adjusted, and then the valve 105 is closed. Subsequently, in an oxidation gas supply step of step S76, the valve 117 is opened, the oxidation gas flow rate is adjusted by the mass flow controller 116, the opening of the conductance valve 118 is adjusted, and then the valve 117 is closed. Subsequently, in a metal raw material gas supply step of step S77, the valve 110 is opened, the bubbling gas flow rate is adjusted by the mass flow controller 108, the opening of the conductance valve 118 is adjusted, and then the valve 110 is closed. Subsequently, in an oxidation gas supply step of step S78, the valve 117 is opened, the oxidation gas flow rate is adjusted by the mass flow controller 116, the opening of the conductance valve 118 is adjusted, and then the valve 117 is closed. The steps S75 to step S78 are repeated until reaching a required number of cycles.

Although only the metal raw material gas is supplied in the steps S73 and S77 in the control process shown in FIG. 14, gas mixture of the metal raw material gas and the Si raw material gas may be supplied. In that case, a series of control operations are performed in the steps S73 and S77, consisting of open operation of the valves 105 and 110, flow rate adjustment by the mass flow controller 103 and the mass flow controller 108, opening adjustment for the conductance valve 118, and close operation of the valves 105 and 110. A displacement gas (inert gas) may be supplied at the same time with the supply of the oxidation gas or the raw material gas in each of the gas supply steps of steps S71 to S78. In that case, a series of control operations consisting of open operation of the valve 106, displacement gas flow rate adjustment by the mass flow controller 104, and close operation of the valve 106 may be added in each of the gas supply steps. Further, a step of displacing the oxidation gas or the raw material gas may be set after each of the gas supply steps in FIG. 14. In that case, the displacement gas from the displacement gas source 102 may be introduced into the film formation chamber 113 by opening the valve 106 after closing of the valve 117, the valve 105 or the valve 110, adjusting the displacement gas flow rate by the mass flow controller 104, and adjusting the conductance valve 118.

Figure 15:
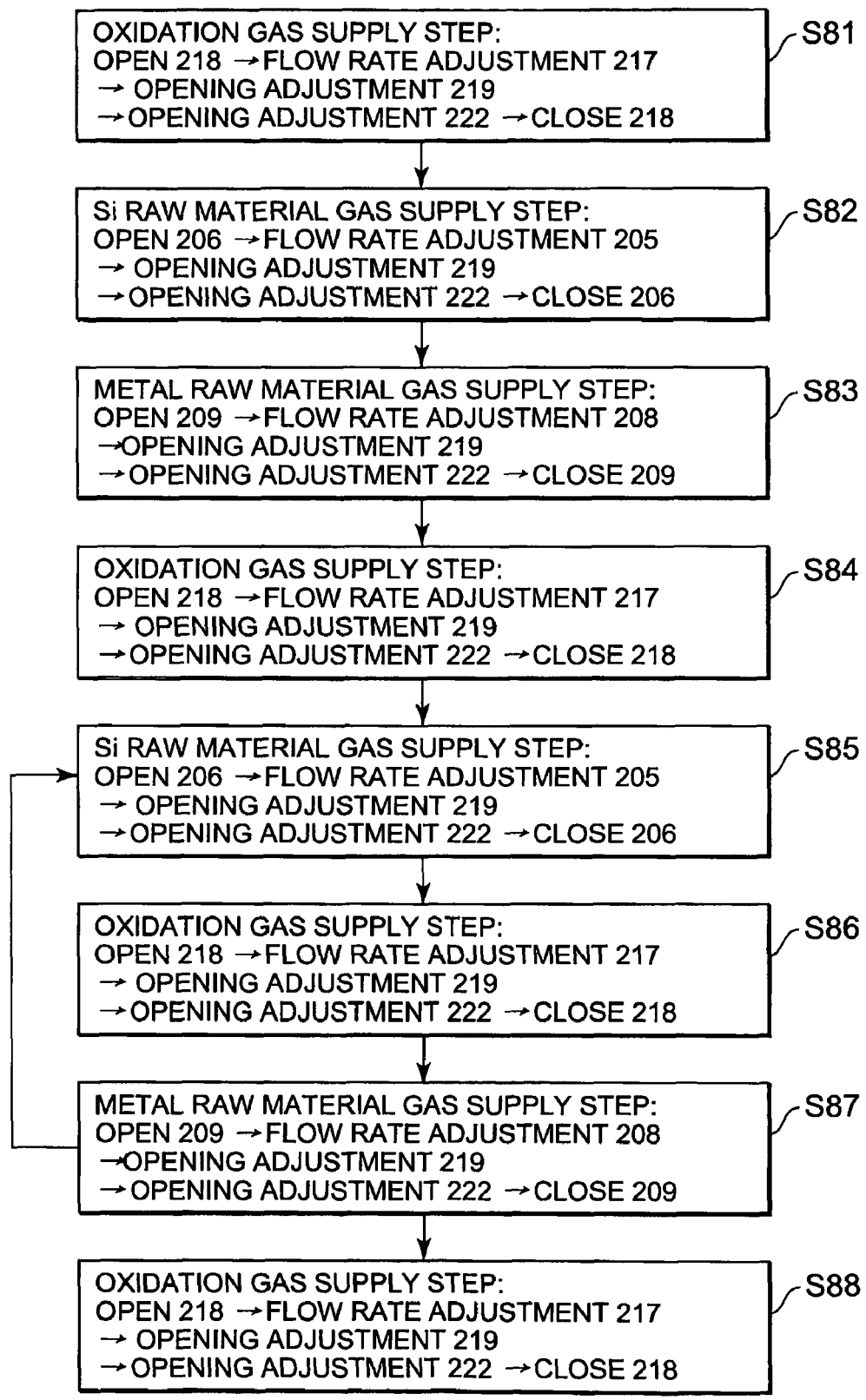
FIG. 15 is a flowchart showing a control process when the fourth embodiment of the present invention is applied to the film formation apparatus shown in FIG. 3.

In order to carry out the gas supply sequence shown in FIG. 13 by using the film formation apparatus shown in FIG. 3, it is preferable to use a control process shown in FIG. 15.

Referring to FIG. 15, in an oxidation gas supply step of step S81, the valve 218 is opened, the oxidation gas flow rate is adjusted by the mass flow controller 217, the opening of the conductance valves 222 and 219 is adjusted, and then the valve 218 is closed. Subsequently, in a Si raw material gas supply step of step S82, the valve 206 is opened, the Si raw material gas flow rate is adjusted by the mass flow controller 205, the opening of the conductance valves 222 and 219 is adjusted, and then the valve 206 is closed. Subsequently, in a metal raw material gas supply step of step S83, the valve 209 is opened, the metal raw material gas flow rate is adjusted by the mass flow controller 208, the opening of the conductance valves 222 and 219 is adjusted, and then the valve 209 is closed. Subsequently, in an oxidation gas supply step of step S84, the valve 218 is opened, the oxidation gas flow rate is adjusted by the mass flow controller 217, the opening of the conductance valves 222 and 219, and then the valve 218 is closed. Subsequently, in a Si raw material gas supply step of step S85, the valve 206 is opened, the Si raw material gas flow rate is adjusted by the mass flow controller 205, the opening of the conductance valves 222 and 219 is adjusted, and then the valve 206 is closed. Subsequently, in an oxidation gas supply step of step S86, the valve 218 is opened, the oxidation gas flow rate is adjusted by the mass flow controller 217, the opening of the conductance valves 222 and 219 is adjusted, and then the valve 218 is closed. Subsequently, in a metal raw material gas supply step of step S87, the valve 209 is opened, the metal raw material gas flow rate is adjusted by the mass flow controller 208, the opening of the conductance valves 222 and 219 is adjusted, and then the valve 209 is closed. Subsequently, in an oxidation gas supply step of step S88, the valve 218 is opened, the oxidation gas flow rate is adjusted by the mass flow controller 217, the opening of the conductance valves 222 and 219 is adjusted, and then the valve 218 is closed. The steps S85 to step S88 are performed until reaching a required number of cycles.

Although only the metal raw material gas is supplied in the steps S83 and S87 in the control process shown in FIG. 15, gas mixture of the metal raw material gas and the Si raw material gas may be supplied. In that case, a series of control operations consisting of open operation of the valves 209 and 206, flow rate adjustment by the mass flow controllers 208 and 205, opening adjustment for the conductance valves 222 and 219, and close operation of the valves 209 and 206 are performed. A displacement gas (inert gas) may be supplied in the gas supply steps of steps S81 to S88, at the same time with the supply of the oxidation gas or the raw material gas. In that case, a series of control operations may be added in each of the gas supply steps, the control operations consisting of open operation of the valve 215, flow rate adjustment by the mass flow controller 214, and close operation of the valve 215, or consisting of open operation of the valve 203, flow rate adjustment by the mass flow controller 202, and close operation of the valve 203, or consisting of open operation of the valve 212, flow rate adjustment by the mass flow controller 211, and close operation of the valve 212. Further, a step of displacing the oxidation gas or the raw material gas may be set after each of the gas supply steps of steps S81 to S88 in FIG. 15. In that case, the displacement gas from the displacement gas source 213, 201 or 210 may be introduced into the film formation chamber 226 by performing, after each of the gas supply steps, a series of operations consisting of open operation of the valve 215, flow rate adjustment by the mass flow controller 214, and close operation of the valve 215, or a consisting of open operation of the valve 203, flow rate adjustment by the mass flow controller 202, and close operation of the valve 203, or consisting of open operation of the valve 212, flow rate adjustment by the mass flow controller 211, and close operation of the valve 212, while at the same time adjusting the opening of the conductance valves 222 and 219.

Fifth Embodiment

Figure 16:
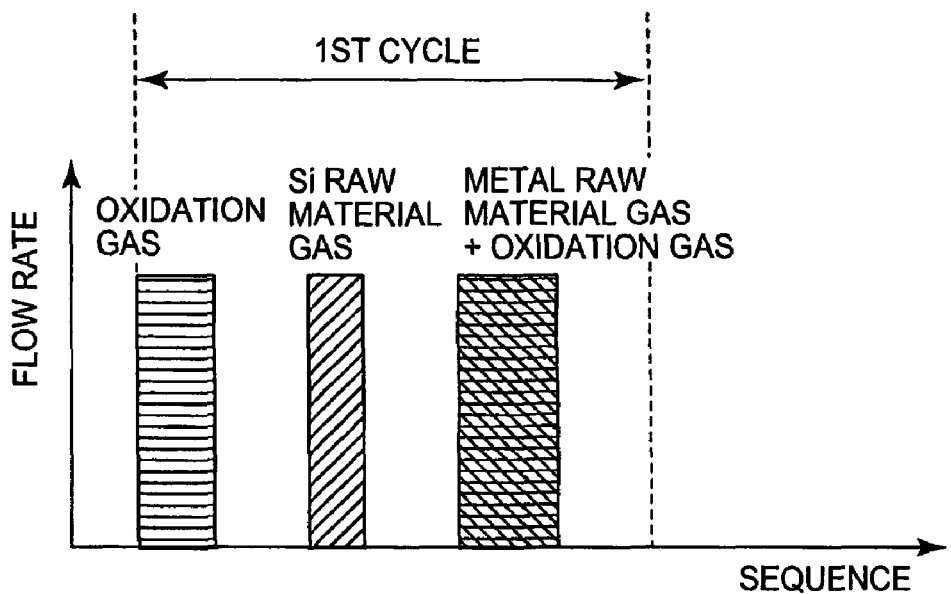
FIG. 16 is a sequence diagram showing a process for supplying raw material gases and an oxidation gas according to a fifth embodiment of the present invention.

FIG. 16 is a sequence diagram showing a gas supply process in a film formation method according to a fifth embodiment of the present invention. According to the fifth embodiment, a first step of supplying an oxidation gas onto the substrate to be treated, a second step of supplying a Si raw material gas as a first raw material gas, and a third step of supplying a metal raw material gas as a second raw material gas and the oxidation gas are performed. In this embodiment, one cycle is formed by these three steps plus a purge step of displacing the gas used in the third step with a displacement gas. The first step to this purge step may be repeated for a plurality of times as repeated cycles. In the third step of the sequence of FIG. 16, gas mixture of the first raw material gas and the second raw material gas may be supplied together with the oxidation gas. Further, a step of displacing the oxidation gas or the raw material gas with the displacement gas may be set between the first step and the second step, or between the second step and the third step. The displacement gas may be introduced into the film formation chamber as a carrier gas together with the raw material gas and/or the oxidation gas.

Figure 17:
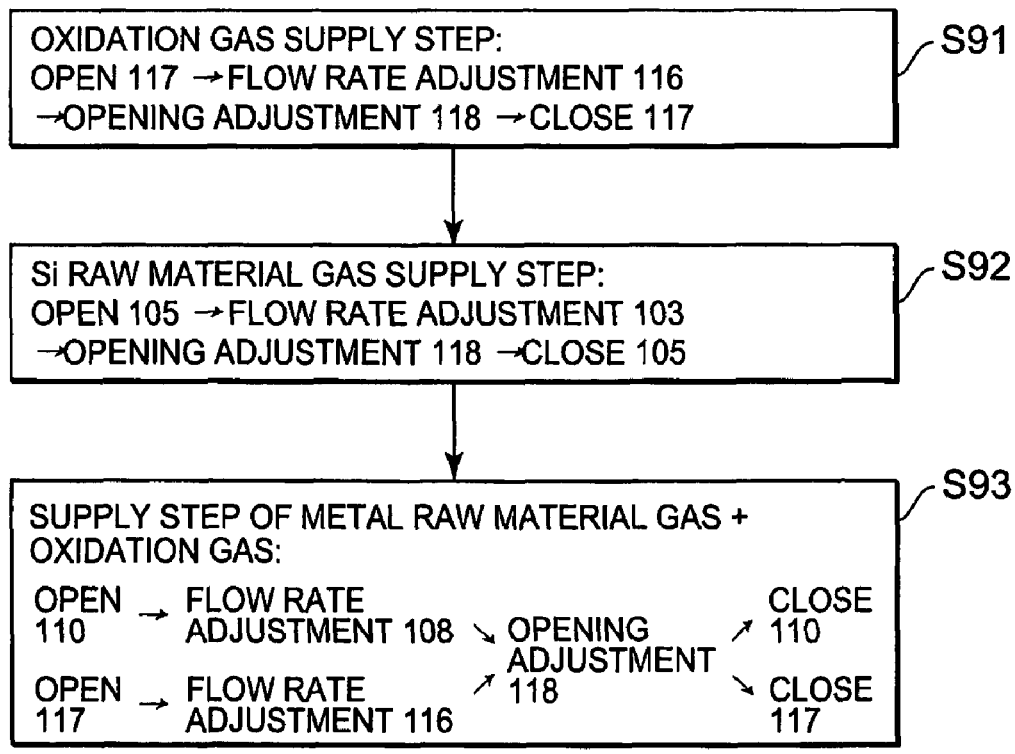
FIG. 17 is a flowchart showing a control process when the fifth embodiment of the present invention is applied to the film formation apparatus shown in FIG. 2.

In order to perform the gas supply sequence shown in FIG. 16 by using the film formation apparatus shown in FIG. 2, it is preferable to use a control process shown in FIG. 17.

Referring to FIG. 17, in an oxidation gas supply step of step S91, the valve 117 is opened, the oxidation gas flow rate is adjusted by the mass flow controller 116, the opening of the conductance valve 118 is adjusted, and then the valve 117 is closed. Subsequently, in a Si raw material gas supply step of step S92, the valve 105 is opened, the Si raw material gas flow rate is adjusted by the mass flow controller 103, the opening of the conductance valve 118 is adjusted, and then the valve 105 is closed. Subsequently, in a metal raw material gas/ oxidation gas supply step of step S93, the valves 110 and 117 are opened, the bubbling gas flow rate and the oxidation gas flow rate are adjusted by the mass flow controller 108 and the mass flow controller 116, the opening of the conductance valve 118 is adjusted, and then the valves 110 and 117 are closed.

Although only the metal raw material gas is supplied as a raw material gas in step S93 in the control process shown in FIG. 17, gas mixture of the metal raw material gas and the Si raw material gas may be supplied. In that case, a series of control operations are performed in the step S93, consisting of open operation of the valves 105, 110 and 117, flow rate adjustment by the mass flow controllers 103, 108 and 116, opening adjustment for the conductance valve 118, and close operation of the valves 105, 110 and 117. A displacement gas (inert gas) may be supplied at the same time with the supply of the oxidation gas or the raw material gas in each of the gas supply steps of steps S91 to S93. In that case, a series of control operations consisting of open operation of the valve 106 and flow rate adjustment by the mass flow controller 104 may be added in each of the gas supply steps. Further, an additional step of displacing the oxidation gas or the raw material gas may be provided between the gas supply steps in FIG. 17. In that case, the displacement gas from the displacement gas source 102 may be introduced into the film formation chamber 113 by opening the valve 106 after closing of the valve 117 or the valve 105, adjusting the displacement gas flow rate by the mass flow controller 104, and adjusting the conductance valve 118.

While several embodiments of the present invention have been described, an essential point in the present invention is to supply the oxidation gas onto the substrate to be treated in the first place and subsequently supply the Si raw material gas. This causes the termination mechanism to act on the deposition of the metal element and enables deposition of the metal element independent from the initial surface state of the substrate to be treated. As a result, the deposition density of the metal element per cycle can be 1E14 atoms/$cm^2$ or less, while the incubation time is shortened, leading to improvement in the linearity of deposition of the metal element. The advantages of the present invention are valid no only when the present invention is applied to the atomic layer adsorption/deposition method but also to the CVD method.

According to the present invention, the Hf deposition density can be controlled by adjusting the supply amount of the Si raw material. The supply amount of the Si raw material can be adjusted by means of the supply time or flow rate. In a region where the supply amount of the Si raw material is low, the Hf deposition density can be adjusted in accordance with the supply amount, and the variation in the Hf deposition density with respect to the supply amount can be suppressed by optimizing the supply amount. Accordingly, it is preferable, in view of the reproducibility, to set the supply amount of the Si raw material in such a region where the variation in the Hf deposition density is suppressed.

Furthermore, the Hf deposition amount can be controlled by adjusting the partial pressure of the Si raw material gas in the Si raw material supply step. The partial pressure of the Si raw material gas is preferably $1E^{-4}$ Torr (0.0133 Pa) or higher, and the partial pressure of the Si raw material gas can be adjusted as required according to a desired Hf deposition amount. If the partial pressure of the Si raw material gas exceeds 100 Torr (13332 Pa), a single molecular layer of Si will be deposited on the substrate to be treated, consuming all the Hf adsorption sites. Accordingly, it is preferable to set the partial pressure of the Si raw material gas to 100 Torr or lower.

Further, since the present invention utilizes only the adsorption sites present on the surface of the substrate to be treated, it is desirable that there are no other adsorption sites. For example, if a raw material containing oxygen is used as a Si raw material gas source, there will be generated, on the Si atoms adsorbed on the substrate to be treated, adsorption sites attributable to the oxygen atoms contained in the raw material in addition to the adsorption sites formed by the oxidation gas. Therefore, Hf will be deposited at the adsorption sites on the surface of the substrate to be treated and on the Si atoms, making it difficult to reduce the deposition amount. Consequently, it is preferable that the raw material gas contains no oxygen. The phenomenon involving Hf as described above is observed as well when the metal raw material is Zr raw material or Al raw material.

In the present invention, the first raw material gas is desirably selected from the group consisting of $Si[(CH_3)_2N]_4$, $Si[(CH_3)_2N]_3H$, $Si[(C_2H_5)_2N]_3H$, and $Si[(CH_3)_2N]_2H_2$.

The second raw material gas is preferably selected from the group consisting of $Hf[(CH_3)_2N]_4$, $Hf[(CH_3)(C_2H_5)N]_4$, and $Hf[(C_2H_5)_2N]_4$ when the metal element is Hf, and from the group consisting of $Zr[(C_2H_5)_2N]_4$, $Zr[(CH_3)_2N]_4$, and $Zr[(CH_3)(C_2H_5)N]_4$ when the metal element is Zr. The second raw material gas is preferably $Al(CH_3)_3$ when the metal element is Al.

The gas mixture is preferably a mixture of at least one Si raw material selected from the group consisting of $Si[(C_2H_5)_2N]_3H$, $Si[(CH_3)_2N]_4$, $Si[(C_2H_5)_2N]_3H$, and $Si[(CH_3)_2N]_2H_2$ and at least one metal raw material selected from the group consisting of $Hf[(CH_3)_2N]_4$, $Hf[(CH_3)(C_2H_5)N]_4$, $Hf[(C_2H_5)_2N]_4$, $Zr[(C_2H_5)_2N]_4$, $Zr[(CH_3)_2N]_4$, $Zr[(CH_3)(C_2H_5)N]_4$, and $Al(CH_3)_3$.

The displacement gas also used as the carrier gas desirably contains an inert gas, specifically at least one selected from the group consisting of $N_2$, Ar, and He.

The adsorption sites formed on the substrate to be treated by the oxidation gas preferably contain oxygen atoms, and more preferably OH groups. Therefore, the oxidation gas is desirably selected from the group consisting of oxygen, ozone, $H_2O$, and $D_2O$, and more desirably from the group consisting of $H_2O$ and $D_2O$.

If the temperature of the substrate to be treated is 200° C. or lower, it will make the deposition reaction difficult to proceed on the substrate to be treated, whereas if the temperature is 500° C. or higher, the raw material gas will be decomposed. Therefore, the temperature of the substrate to be treated is preferably in the range from 200° C. to 500° C., and more preferably in the range from 200° C. to 400° C.

The substrate to be treated is preferably selected from the group consisting of $SiO_2$ and SiON in order to prevent the deterioration of device characteristics due to diffusion of metal elements over the substrate.

Although the description above of the embodiments has been made in relation to the control of the Hf deposition density, the above-mentioned advantageous effects of the present invention can be obtained not only for Hf, Zr and Al but also for La, Pr, Y, Ti, and Ta.

Several examples of the present invention will be described.

EXAMPLE 1

In Example 1, a silicon substrate was used as the substrate to be treated, and film formation was performed on a natural oxide film, a silicon thermal oxide film and a silicon oxynitride film on the silicon substrate. The film formation was performed by using the film formation apparatus shown in FIG. 2. The substrate temperature was set to in the range of 200° C. to 500° C. Tetradiethyl-amino-hafnium ($Hf[(C_2H_5)_2N]_4$) and tris(dimethyl-amino)silicon ($HSi[N(CH_3)_2]_3$) were used as the raw materials, and $H_2O$ was used as the oxidation gas.

Figure 18:
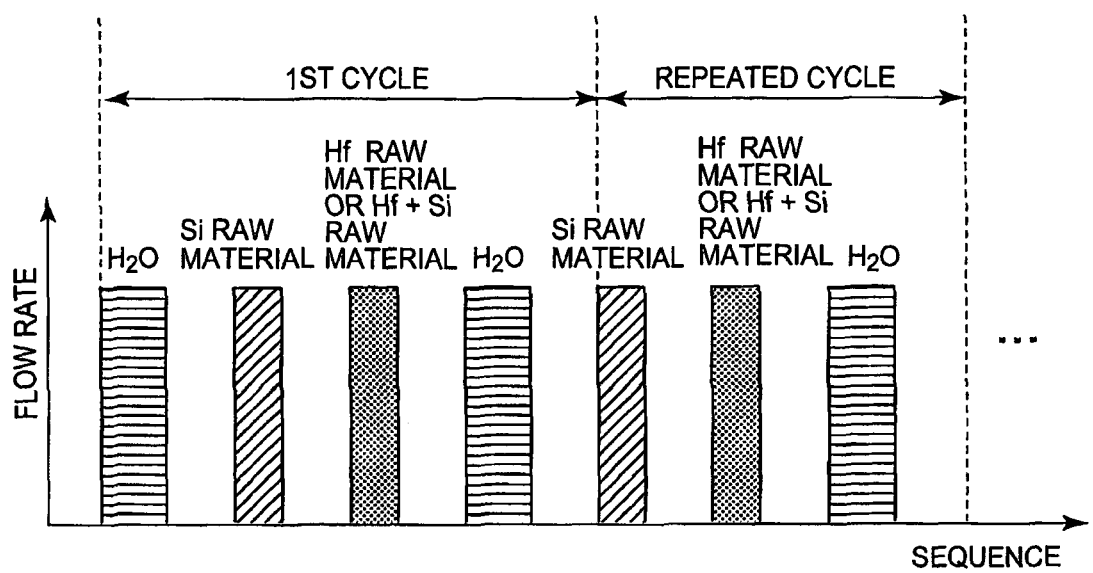
FIG. 18 is a sequence diagram showing a process for supplying raw material gases and an oxidation gas according to Example 1 of the present invention.

FIG. 18 schematically shows the raw material gas supply steps in Example 1.

Referring to FIG. 18, $H_2O$ as an oxidizing agent was firstly supplied onto the surface of the substrate to be treated (first step). The $H_2O$ was supplied by the mass flow controller at a flow rate of 20 sccm for 50 seconds.

Subsequently, a Si raw material gas was supplied (second step). The Si raw material was supplied by the mass flow controller with the flow rate being controlled within the range of 2 sccm to 20 sccm. The partial pressure of the Si raw material gas during the film formation was set within the range from $1E^{-4}$ Torr (0.0133 Pa) to 0.3 Torr (40.0 Pa). The supply time was set within the range from 0 sec to 300 sec. The temperature of the Si raw material was set to 45° C.

Subsequently, a Hf raw material gas was supplied (third step). The Hf raw material was supplied by bubbling of a nitride carrier gas from a container of 87° C. at a flow rate of 20 sccm. The supply time was set within the range from 5 sec to 20 sec. Additionally, an experiment was conducted also on a case in which the Hf raw material and the Si raw material were supplied simultaneously. The pressure was set within the range from $1E^{-4}$ Torr to 100 Torr during the film formation.

Subsequently, $H_2O$ was supplied for the purpose of oxidation of the surface of the Hf and Si elements (fourth step). The conditions of supplying $H_2O$ were the same as in the first step. In Example 1, the first to fourth steps form the first cycle. After the first cycle, a repeated cycle consisting of the second to fourth steps was repeated for one to ten times. Additionally, an experiment was conducted also on a case in which a displacement step was provided between the steps.

Figure 19:
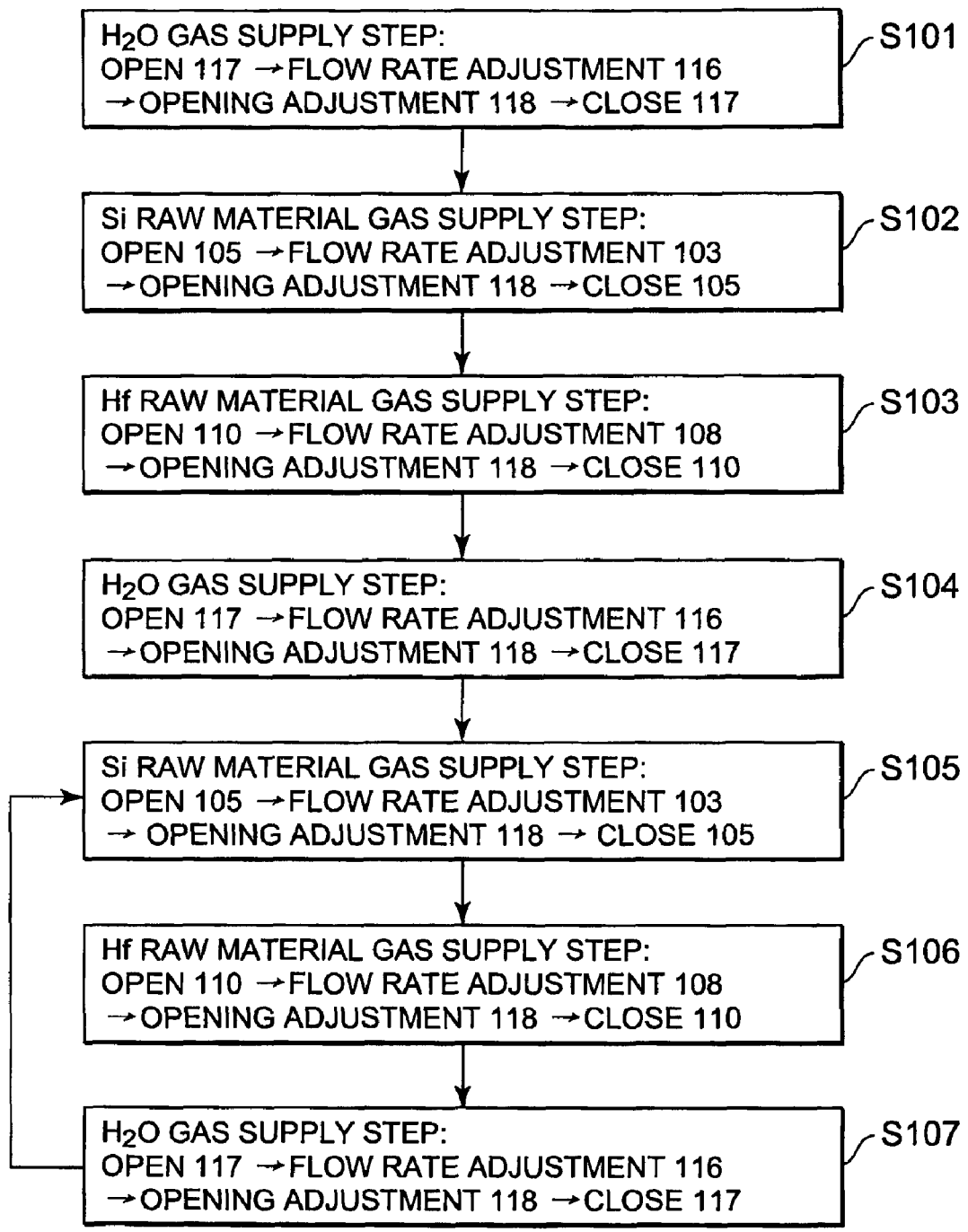
FIG. 19 is a flowchart showing a control process of the film formation apparatus according to Example 1 of the present invention.

A control process of the film formation apparatus (FIG. 2) used in Example 1 is shown in FIG. 19.

Referring to FIG. 19, in a $H_2O$ gas supply step of step S101, the valve 117 is opened, the $H_2O$ gas flow rate is adjusted by the mass flow controller 116, the opening of the conductance valve 118 is adjusted, and then the valve 117 is closed.

Subsequently, in a Si raw material gas supply step of step S102, the valve 105 is opened, the Si raw material gas flow rate is adjusted by the mass flow controller 103, the opening of the conductance valve 118 is adjusted, and then valve 105 is closed.

Subsequently, in a Hf raw material gas supply step of step S103, the valve 110 is opened, the bubbling gas flow rate is adjusted by the mass flow controller 108, the opening of the conductance valve 118 is adjusted, and then the valve 110 is closed.

Subsequently, in a $H_2O$ gas supply step of step S104, the valve 117 is opened, the H2O gas flow rate is adjusted by the mass flow controller 116, the opening of the conductance valve 118 is adjusted, and then the valve 117 is closed.

The steps S105 to S107 are the same as those of the steps S102 to S104, and the steps S105 to S107 are carried within the range of one to 100 cycles.

When gas mixture of the Hf raw material gas and the Si raw material gas is supplied in the steps S103 and S106, a series of control operations are performed in steps S103 and S106, consisting of open operation of the valves 105 and 110, flow rate adjustment by the mass flow controller 103 and the mass flow controller 108, opening adjustment for the conductance valve 118, and close operation of the valves 105 and 110.

Figure 20:
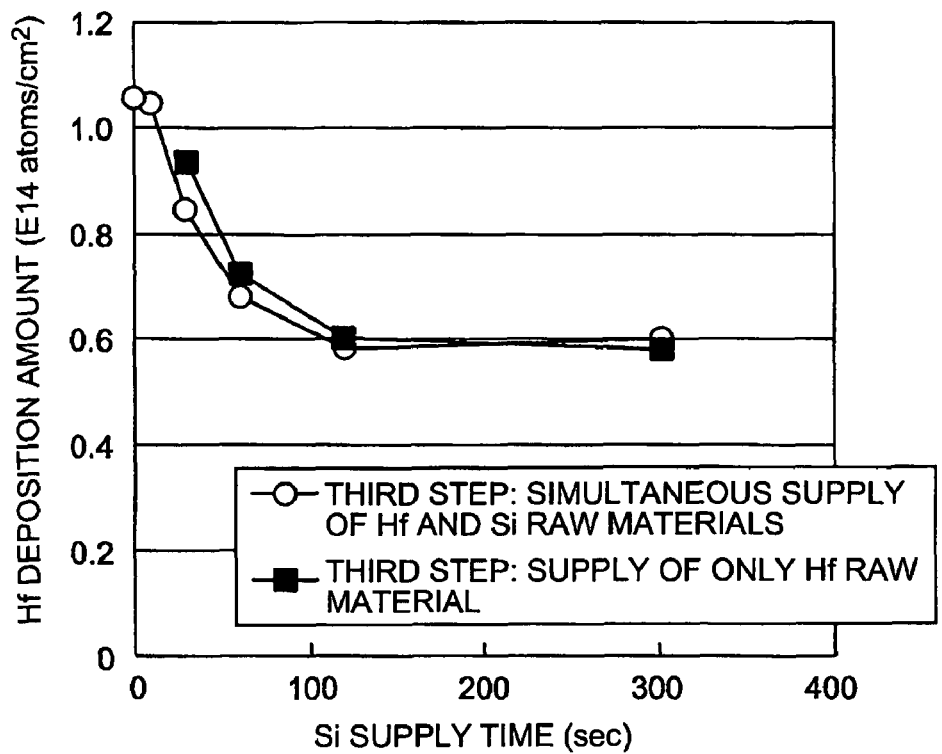
FIG. 20 is a graph showing the dependence of Hf deposition density on the Si raw material supply time in Example 1 of the present invention.

FIG. 20 shows the dependence of Hf deposition density on Si raw material supply time in the second step when the first cycle of film formation was performed on the surface of the natural oxide film on the silicon substrate. The Si raw material flow rate in the second step was 20 sccm. This graph also shows the Hf deposition density for both cases in which only the Hf raw material was supplied in the third step and when gas mixture of the Hf raw material and the Si raw material was supplied.

As is clearly seen from FIG. 20, the Hf deposition amount varies depending upon the supply amount of the Si raw material in the second step. The decrease of the Hf deposition amount stops at a certain supply amount of the Si raw material, and a deposition amount of $6E13$ atoms/cm$^2$ is obtained. In the region where the decrease of Hf deposition density stops according to the supply amount of the Si raw material, the Hf deposition density is not affected by the difference in the raw material gas in the third step. This proves that Si cannot be adsorbed at the Hf deposition sites defined by primarily supplying only the Si raw material, according to the deposition mechanism of the present invention as described above with reference to FIG. 6.

Figure 21:
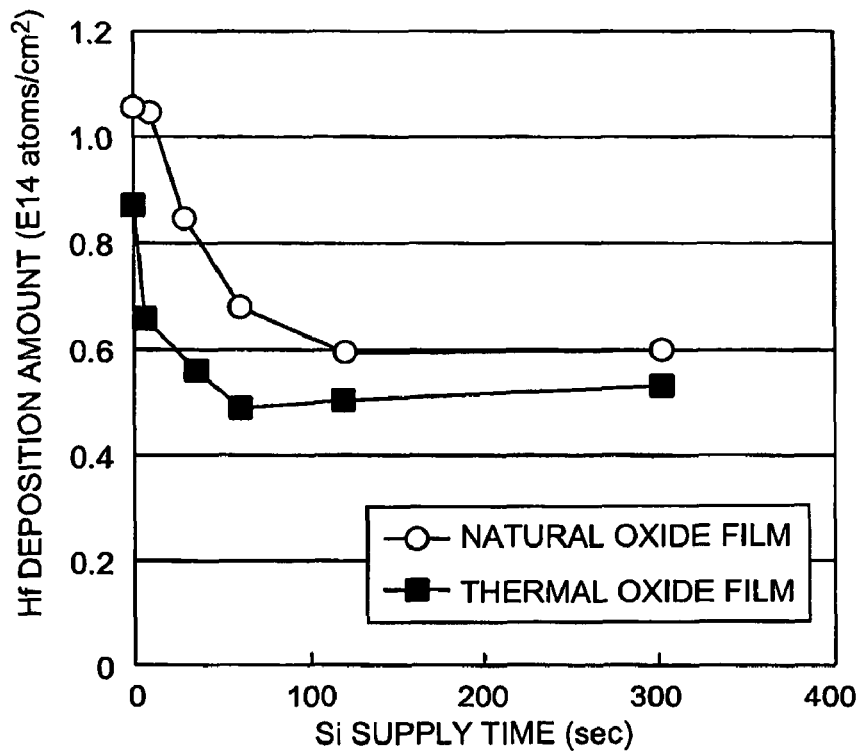
FIG. 21 is a graph showing the dependence of Hf deposition density on a natural oxide film and on a thermal oxide film on the Si raw material supply time in Example 1 of the present invention.

FIG. 21 shows the dependence of Hf deposition amount on supply time of the Si raw material in the second step when the first cycle of film formation was performed on the surface of a natural oxide film on the silicon substrate and on the surface of a 19 Å thick thermal oxide film, respectively. The flow rate of the Si raw material in the second step was 20 sccm. As seen from FIG. 21, the difference between the Hf deposition density on the natural oxide film and that on the thermal oxide film was reduced by the supply of the Si raw material. It is believed that this is because there exist more adsorption sites due to dangling bonds or the like on the natural oxide film than on the thermal oxide film, and this difference in the adsorption sites is a cause of variation of the Hf deposition density. Accordingly, it is believed that, by supplying the Si raw material prior to the Hf raw material, the adsorption sites due to the pre-existing dangling bonds are terminated by Si and hence the variation in the Hf deposition amount according to difference in the surface state of the substrate to be treated can be suppressed. Consequently, as described above, the film formation method according to the present invention is able to solve the problem encountered by the prior art, that is, to suppress the variation in the Hf deposition density due to the difference in the surface state of the substrate to be treated.

Figure 22:
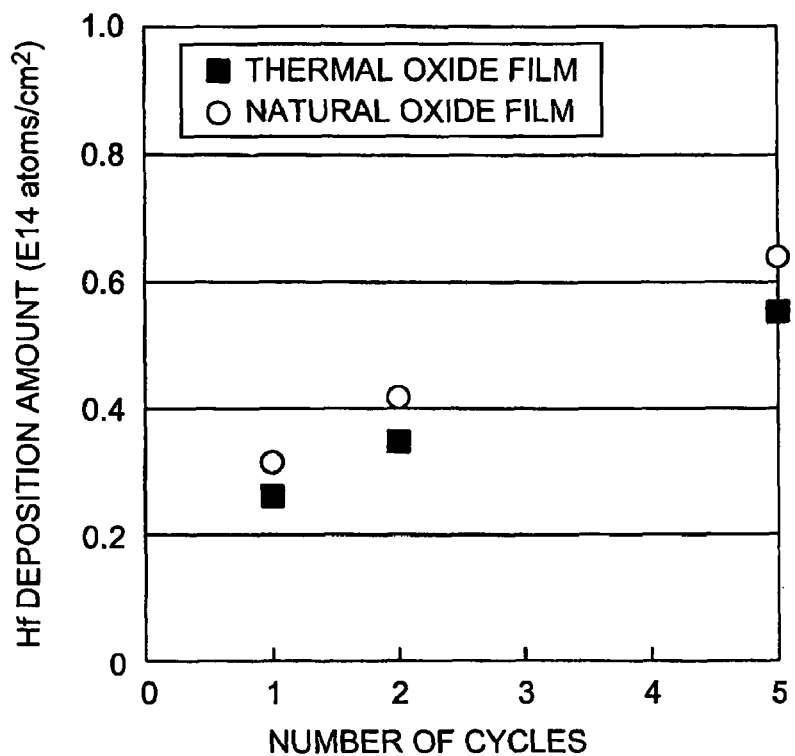
FIG. 22 is a graph showing the dependence of Hf deposition density on a natural oxide film and on a thermal oxide film on the number of cycles in Example 1 of the present invention.

FIG. 22 shows the dependence of Hf deposition density on number of cycles on the surface of a natural oxide film on the silicon substrate and on the surface of a 19 Å thick thermal oxide film. The flow rate of the Si raw material in the second step was 20 sccm, the supply time was 300 seconds, and the partial supply pressure was 0.05 Torr. As shown in FIG. 22, the increase in the Hf deposition density presents a favorable linearity to the number of cycles, not depending on the surface state of the substrate to be treated. This means that the film formation method according to the present invention is able to solve the problem encountered by the prior art, that is, the problem that the linearity of the Hf deposition density is deteriorated on the thermal oxide film.

Figure 23:
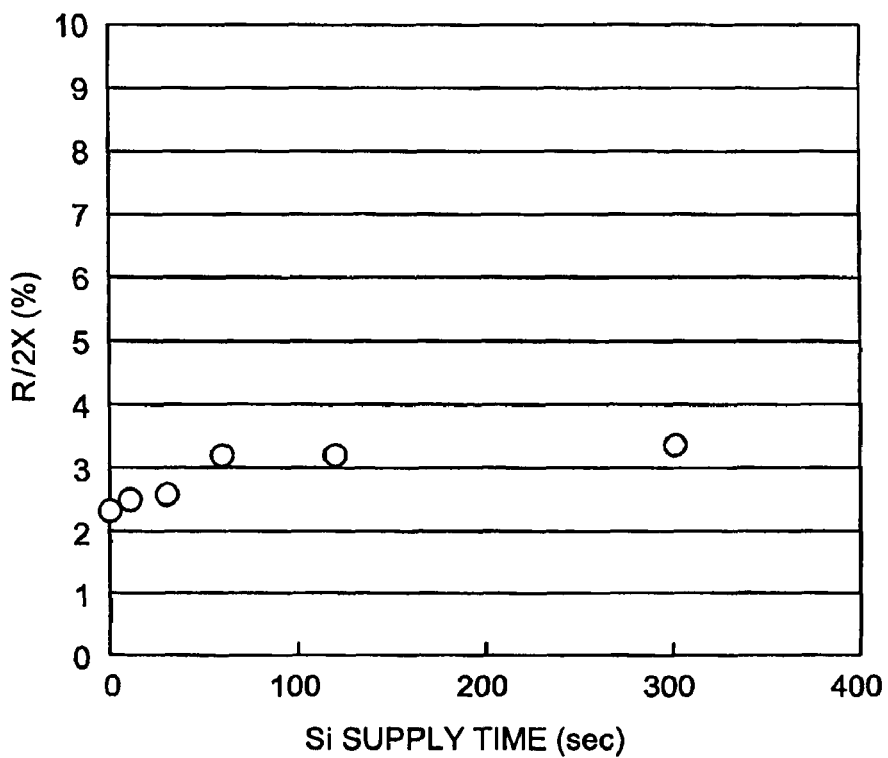
FIG. 23 is a graph showing the dependence of in-plane uniformity of Hf deposition density on the Si raw material supply time in Example 1 of the present invention.

FIG. 23 shows the dependence of in-plane uniformity (R/2×) of Hf deposition amount on supply time of the Si raw material in the second step when one cycle of film formation was performed on the surface of the natural oxide film on the silicon substrate. The flow rate of the Si raw material in the second step was 20 sccm. The in-plane uniformity was calculated by (maximum measurement value-minimum measurement value)/(average measurement value×2)×100(%), at a measurement point of the Hf deposition amount in the plane. As shown in FIG. 23, a uniformity of about 3% can be obtained not depending on the supply time of the Si raw material, and thus more favorable uniformity can be provided in comparison with the prior art.

Figure 24:
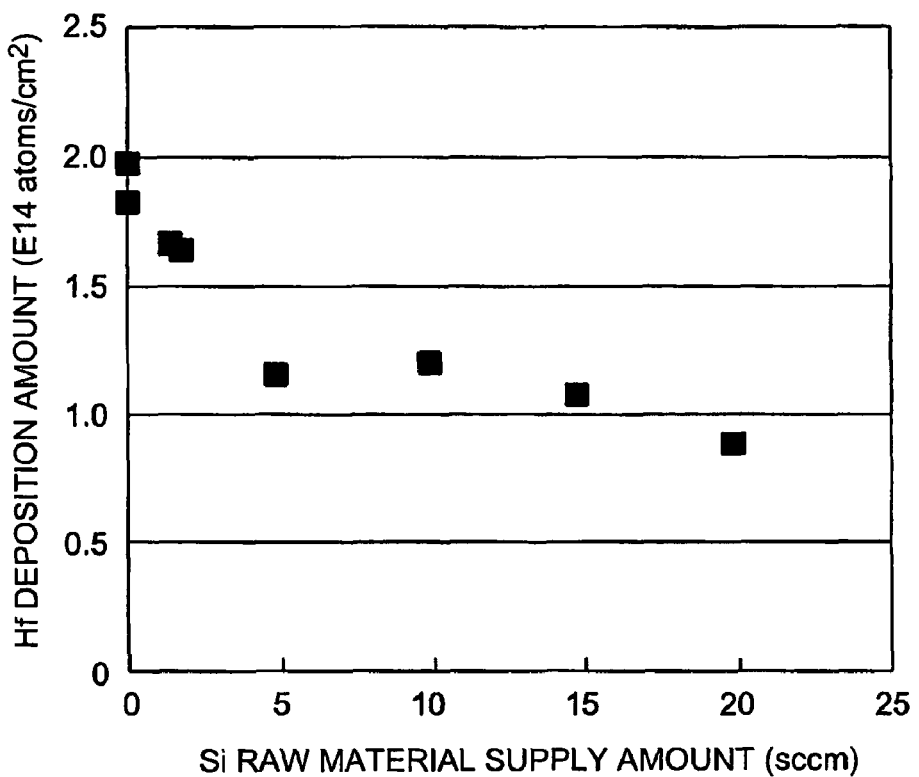
FIG. 24 is a graph showing the dependence of Hf deposition density on the Si raw material supply time in Example 1 of the present invention.

FIG. 24 shows the dependence of Hf deposition density on flow rate of the Si raw material in the second step when the first cycle of film formation was performed on the surface of the natural oxide film of the silicon substrate. The flow rate of the Si raw material in the second step was 20 sccm. As shown in FIG. 24, the Hf deposition density is reduced in accordance with the increase in flow rate of the Si raw material. It is seen from this that the Hf deposition density can be controlled by means of its supply amount that is adjustable by the supply time or flow rate of the Si raw material.

Figure 25:
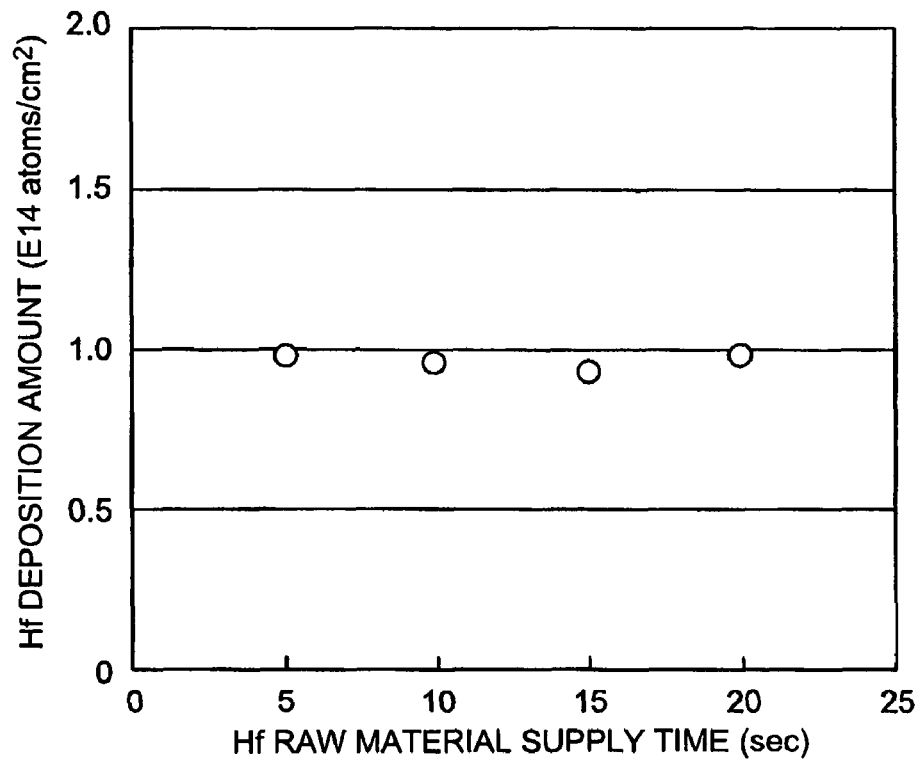
FIG. 25 is a graph showing the dependence of Hf deposition density on the Hf raw material supply time in Example 1 of the present invention.

FIG. 25 shows the dependence of Hf deposition amount on supply time of the Hf raw material in the third step when the first cycle of film formation was performed on the surface of the natural oxide film on the silicon substrate. The flow rate of the Si raw material in the second step was 20 sccm, and the supply time was 10 sec. It can be seen from FIG. 25 that the Hf deposition amount is constant regardless of the supply time of the Hf raw material. This proves that the film formation method of the present invention provides broad film formation margin with respect to the supply time of the Hf raw material. This result also proves that the film formation method of the present invention has a growth termination mechanism.

Figure 26:
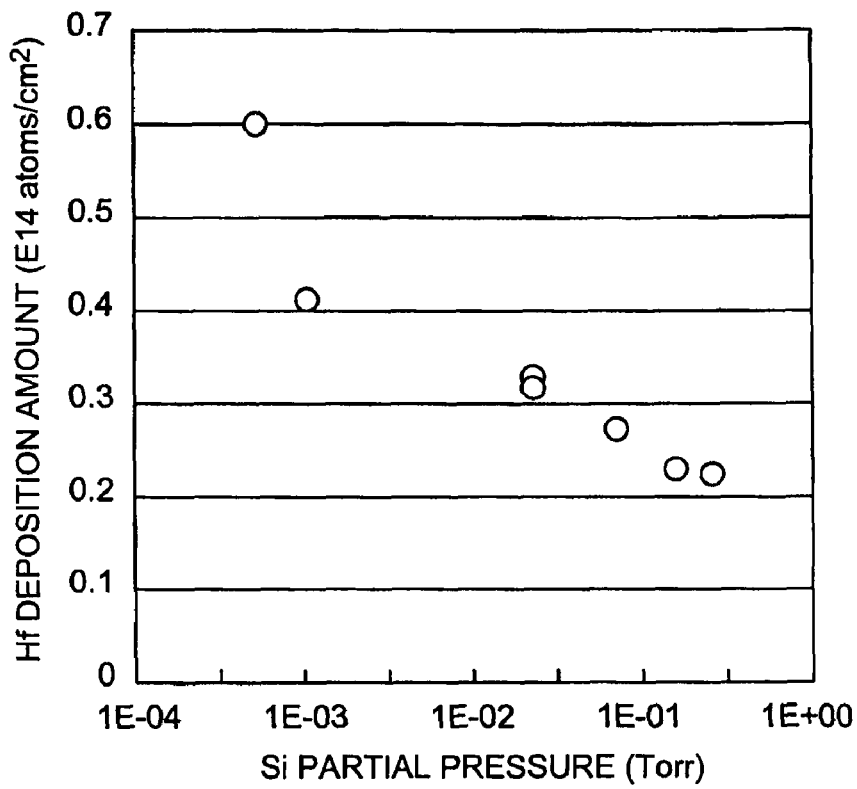
FIG. 26 is a graph showing the dependence of Hf deposition density on the partial supply pressure of a Si raw material in Example 1 of the present invention.

FIG. 26 shows the dependence of Hf deposition amount on partial pressure of the Si raw material gas during the Si raw material supply process in the second step when the first cycle of film formation was performed on the surface of the natural oxide film on the silicon substrate. The flow rate of the Si raw material in the second step was 20 sccmn, and the supply time was 300 sec. It can be seen from FIG. 26 that the Hf deposition amount is reduced in accordance with the increase of the partial pressure of the Si raw material gas. Thus, according to the present invention, the Hf deposition amount can be controlled arbitrarily by means of the partial pressure of the Si raw material gas, and a deposition amount of as low as 2E13 atoms/cm$^2$ can be realized when the partial pressure is 0.3 Torr.

Figure 27:
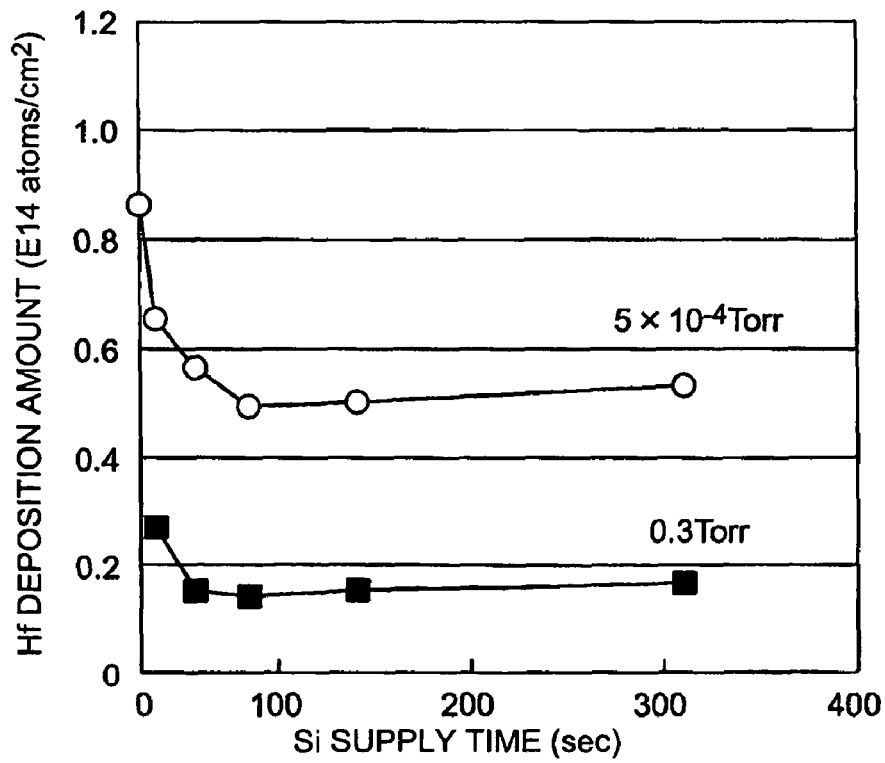
FIG. 27 is a graph showing the dependence of Hf deposition density on the Si raw material supply time when the partial supply pressure of the Si raw material is $5E^{-4}$ Torr and 0.3 Torr in Example 1 of the present invention.

FIG. 27 shows the dependence of Hf deposition amount on supply time of the Si raw material when the first cycle of film formation was performed on the surface of a 19 Å thick silicon thermal oxide film on the silicon substrate, and when the partial supply pressure of the Si raw material in the second step was $5 \times 10^{-4}$ Torr (0.0667 Pa) and 0.3 Torr (40.0 Pa), respectively. As shown in FIG. 27, the Hf deposition amount becomes constant according to the increase of the supply time of the Si raw material at either of the Si partial pressures. It can be seen from this that the film formation apparatus of the present invention described above is able to control the Si deposition state, which determines the Hf deposition sites, by means of the partial pressure and supply time of the Si raw material gas. As shown in FIG. 27, the film formation apparatus of the present invention provides broad process margin with respect to the supply the time, and is able to determine the deposition of Si in a self-consistent manner.

Figure 28:
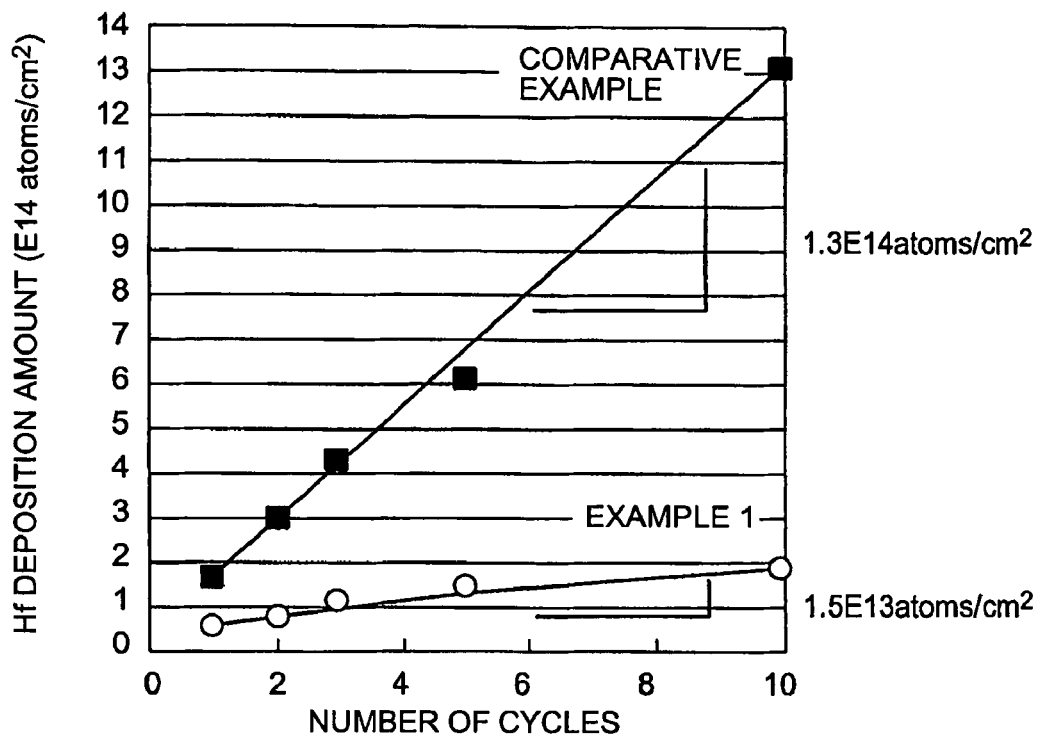
FIG. 28 is graph showing the dependence of Hf deposition density on the number of cycles in Example 1 of the present invention.

FIG. 28 shows the dependence of Hf deposition amount on number of cycles when a Hf film was formed on the surface of the natural oxide film on the silicon substrate. FIG. 28 also shows, as a comparative example, the dependence of Hf deposition amount on number of cycles when the Si raw material supply process of the second step in Example 1 was not performed. The flow rate of the Si raw material in the second step was 20 sccm, the supply time was 120 sec, and the partial supply pressure was $5 \times 10^{-4}$ Torr (0.0667 Pa). As seen from FIG. 28, the Hf deposition amount per cycle is 1.5E13 atoms/cm$^2$ in Example 1, and it can be seen that the deposition density can be controlled in a range which is lower by one digit than 1.3E14 atoms/cm$^2$ of the comparative example.

Figure 29:
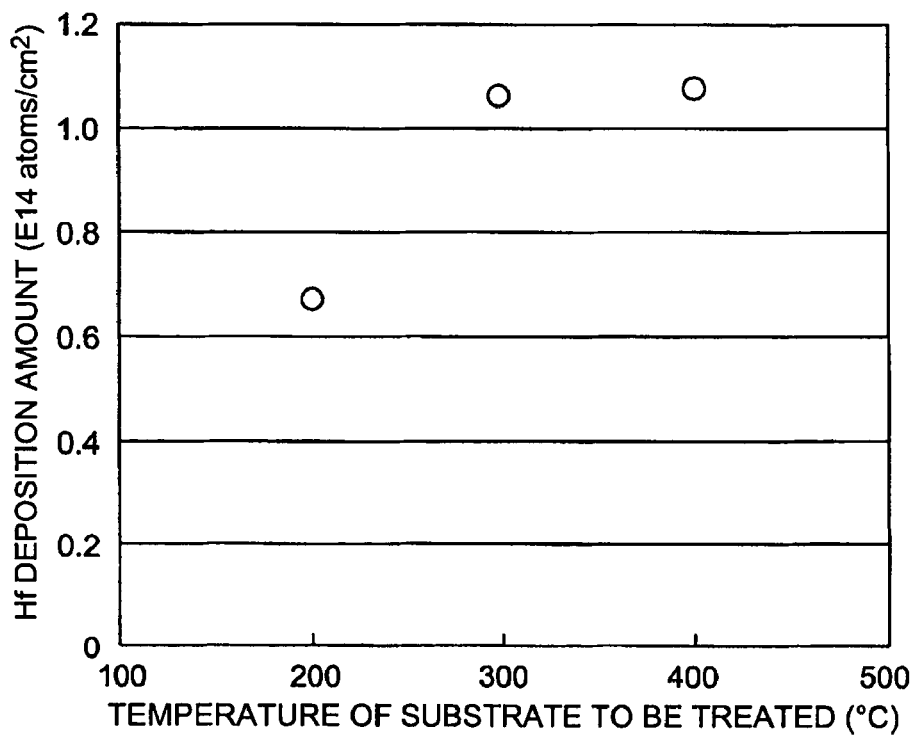
FIG. 29 is graph showing the dependence of Hf deposition density on the temperature of a substrate to be treated in Example 1 of the present invention.

FIG. 29 shows the dependence of Hf deposition density on temperature of the substrate to be treated when one cycle of film formation was performed on the natural oxide film on the silicon substrate. As seen from FIG. 29, the Hf deposition density remains constant regardless of the temperature when the temperature of the substrate to be treated is in the range from 300° C. to 400° C. It can also be seen that, when the temperature of the substrate to be treated is 200° C., the Hf deposition density is lower than when the substrate temperature is 300° C. It is believed that this is because decomposition and adsorption of the raw material gas on the surface of the substrate have been reduced as a result of the decrease in temperature of the substrate to be treated. This suggests that the deposition density can be reduced further by means of the temperature of the substrate to be treated. Accordingly, in order to further reduce the Hf deposition density in the present invention, the temperature of the substrate to be treated can be set within a range from 200° C. to 300° C. However, the temperature is preferably set within the range from 300° C. to 400° C., when taking into consideration the process margin with respect to the substrate temperature for stable film formation.

While film formation was performed on the surface of the natural oxide film or on the surface of the thermal oxide film on the silicon substrate in Example 1 described above, the same results as above could be obtained also when film formation was performed on a silicon oxynitride film on the silicon substrate.

Further, the same results as above could be obtained when using $Si[(CH_3)_2N]_4$, $Si[(C_2H_5)_2N]_3H$, or $Si[(CH_3)_2N]_2H_2$ as the first raw material gas.

Further, the same results as above could be obtained when using $Hf[(CH_3)_2N]_4$ or $Hf[(CH_3)(C_2H_5)N]_4$ as the second raw material gas.

Further, the same results as above could be obtained when using, as the second raw material gas, mixture of at least one Si raw material selected from the group consisting of $Si[(C_2H_5)_2N]_3H$, $Si[(CH_3)_2N]_4$, $Si[(C_2H_5)_2N]_3H$, and $Si[(CH_3)_2N]_2H_2$ and at least one Hf raw material selected from the group consisting of $Hf[(C_2H_5)_2N]_4$, $Hf[(CH_3)_2N]_4$, and $Hf[(CH_3)(C_2H_5)N]_4$.

Further, the same results as above could be obtained when setting a step of displacing the raw material gas or the oxidation gas between the first step, the second step, the third step, and the fourth step.

Further, the same results as above could be obtained when supplying an inert gas at the same time in the step of supplying the raw material gas or the oxidation gas.

As described above, Example 1 provides the following advantageous effects.

(1) A Hf deposition density of 1E14 atoms/cm$^2$ or lower per cycle, which is difficult to achieve in the prior art, can be achieved.

(2) The Hf deposition density can be arbitrarily controlled not only by means of the number of cycles of film formation but also by means of the supply amount or partial supply pressure of the Si raw material.

(3) The Hf adsorption sites are determined by the Si deposition state. Therefore, the Hf deposition state is determined in a self-consistent manner, causing the growth termination mechanism to work. As a result, favorable in-plane uniformity, controllability, reproducibility, and process margin can be obtained.

(4) Variation in the Hf deposition density due to difference in the surface state of the substrate to be treated can be suppressed.

(5) Effect of the incubation time can be suppressed, the linearity of Hf deposition density to the number of cycles or film formation time can be improved.

EXAMPLE 2

Example 2 is different from Example 1 in that tetra-t-butoxy silicon ($Si[O-t-C_4H_9]_4$) was used as the first raw material gas containing Si. The temperature of the Si raw material was 95° C., and the flow rate was adjusted within the range from 0 to 2 sccm by the mass flow controller. The other conditions were same as in Example 1.

Figure 30:
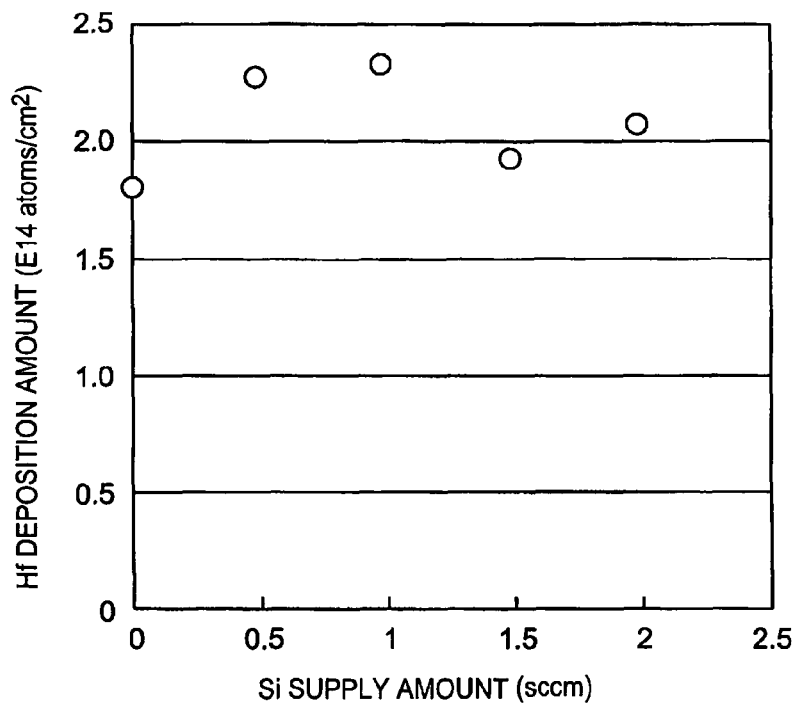
FIG. 30 is a graph showing the dependence of Hf deposition density on the Si raw material supply amount in Example 2 of the present invention.

FIG. 30 shows the dependence of Hf deposition amount on the supply amount of the Si raw material in the second step when one cycle of film formation was performed on the surface of the natural oxide film on the silicon substrate (substrate to be treated). As shown in FIG. 30, when tetra-t-butoxy silicon is used as the Si raw material, unlike Example 1, the Hf deposition density is about 2E14 atoms/cm$^2$, not depending on the supply amount of the Si raw material. It is believed that this means that one molecular layer of $HfO_2$ has been deposited on the silicon substrate, and hence, in Example 2, the density of the Hf deposition sites cannot be reduced by means of the supply process of the Si raw material. A conceivable factor for this may be an effect of oxygen contained in the Si raw material. Specifically, there exist adsorption sites attributable to oxygen contained in the raw material on the Si deposited on the silicon substrate, and Hf can be deposited also on such deposited Si. It is believed this makes it impossible to achieve the reduction of the Hf deposition density as in Example 1.

Example 2 proves that in the film formation method of the present invention, it is desirable to use an oxygen-free raw material as the silicon raw material.

EXAMPLE 3

Figure 31:
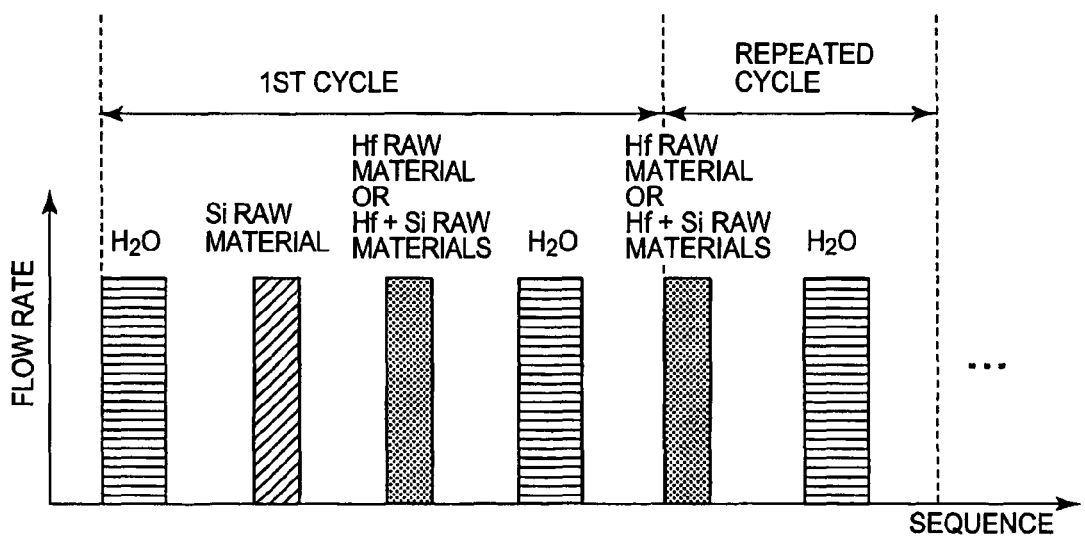
FIG. 31 is a sequence diagram showing a process for supplying raw material gases and an oxidation gas in Example 3 of the present invention.

FIG. 31 is a sequence diagram showing a gas supply method according to Example 3. Example 3 is different from Example 1 shown in FIG. 18 in the gas supply process in the repeated cycle after the fifth step. Specifically, in Example 3, a repeated cycle consists of a fifth step (Hf raw material supply step) equivalent to the third step, and a sixth step ($H_2O$ supply step) equivalent to the fourth step, while the other conditions are the same as in Example 1. An experiment was also conducted on a case in which a step for gas displacement was set between the steps.

Figure 32:
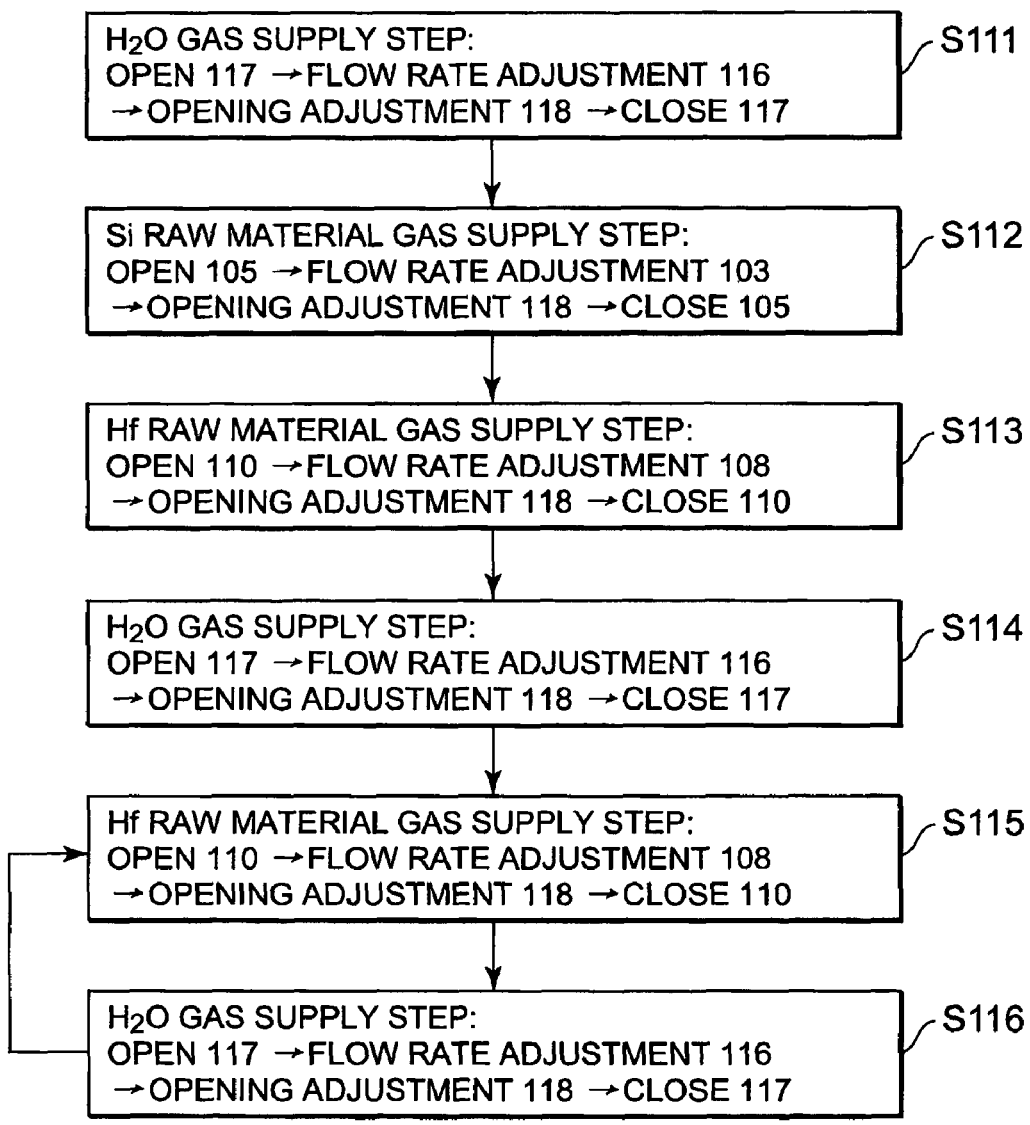
FIG. 32 is a flowchart showing a control process of the film formation apparatus in Example 3 of the present invention.

FIG. 32 shows a control process of a film formation apparatus used in Example 3.

In FIG. 32, in a $H_2O$ gas supply step of step S111, the valve 117 is opened, the H2O gas flow rate is adjusted by the mass flow controller 116, the opening of the conductance valve 118 is adjusted, and then the valve 117 is closed. Subsequently, in a Si raw material gas supply step of step S112, the valve 105 is opened, the Si raw material gas flow rate is adjusted by the mass flow controller 103, the opening of the conductance valve 118 is adjusted, and then the valve 105 is closed. Subsequently, in a Hf raw material gas supply step of step S113, the valve 110 is opened, the bubbling gas flow rate is adjusted by the mass flow controller 108, the opening of the conductance valve 118 is adjusted, and then the valve 110 is closed. Subsequently, in a $H_2O$ gas supply step of step S114, the valve 117 is opened, the $H_2O$ gas flow rate is adjusted by the mass flow controller 116, the opening of the conductance valve 118 is adjusted, and then the valve 117 is closed.

Step S115 to step S116 are the same as those of step S113 to step S114. Step S115 to step S116 were performed until reaching a range of 1 to 100 cycles. When supply gas mixture of the Hf raw material and the Si raw material in step S113 and step S115, a series of control operations are performed, consisting of open operation of the valves 105 and 110, flow rate adjustment by the mass flow controller 103 and the mass flow controller 108, opening adjustment for the conductance valve 118, and close operation of the valves 105 and 110.

Similar evaluation to that in Example 1 was conducted, and it was found that the advantageous effects as follows could be obtained in Example 3.

(1) The Hf deposition density could be controlled to 1E14 atoms/$cm^2$ or lower per cycle by means of the number of cycles and the Si raw material supply conditions.

(2) Favorable in-plane uniformity can be obtained.

(3) The Hf deposition sites are determined self-restrictively by the Si deposition sites, and the Si deposition state can be determined self-restrictively by means of the Si raw material supply conditions.

(4) Example 3 provides a broad process margin with respect to the supply time of the Si raw material and Hf raw material (the self-stop mechanism works on the deposition density).

(5) Variation in deposition amount due to difference in surface state of the substrate to be treated is suppressed.

(6) The absence of incubation time improves the linearity of the deposition density to the number of cycles.

Similar effects could be obtained in the case in which a step of displacing the raw material gas and the oxidation gas was set between the steps.

EXAMPLE 4

Figure 33:
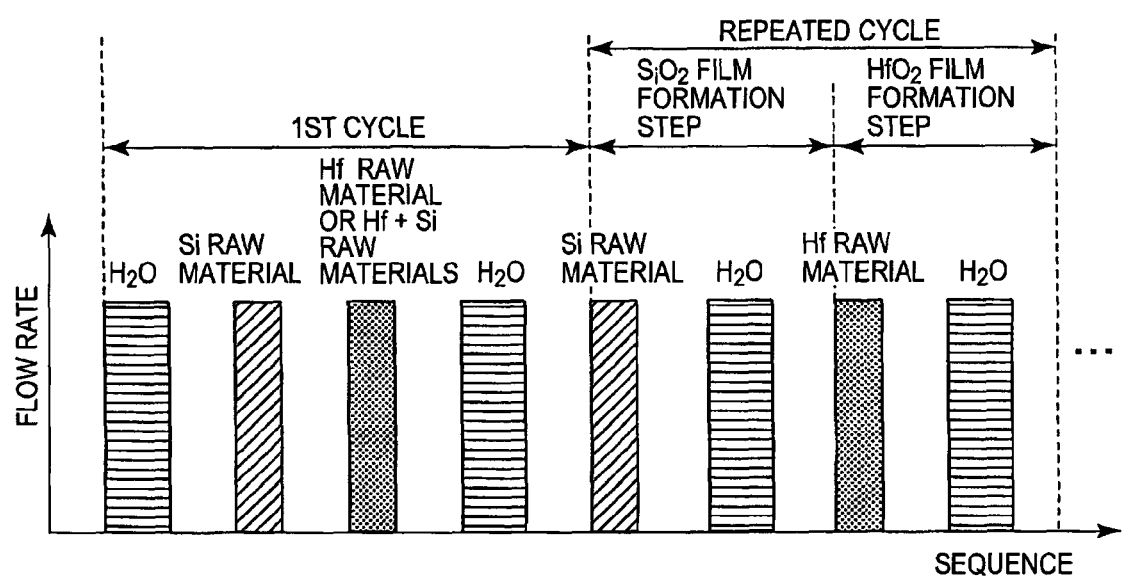
FIG. 33 is a sequence diagram showing a process for supplying raw material gases and an oxidation gas according to Example 4 of the present invention.

FIG. 33 is a sequence diagram showing a gas supply method according to Example 4. Example 4 is different from Example 1 shown in FIG. 18 in that a $SiO_2$ film formation step and a $HfO_2$ film formation step are performed independently from each other in a each repeated cycle in the fifth step or later.

Referring to FIG. 33, after the first to fourth steps which are the same as those in Example 1, a repeated cycle consisting of four steps: a fifth step of supplying a Si raw material gas as the first raw material gas, a sixth step of supplying $H_2O$ gas, a seventh step of supplying a Hf raw material gas as the second raw material gas, and an eighth step of supplying $H_2O$ gas was performed until reaching a range of 1 to 100 cycles. An experiment was conducted also on a case in which a step for gas displacement is set between the steps.

Figure 34:
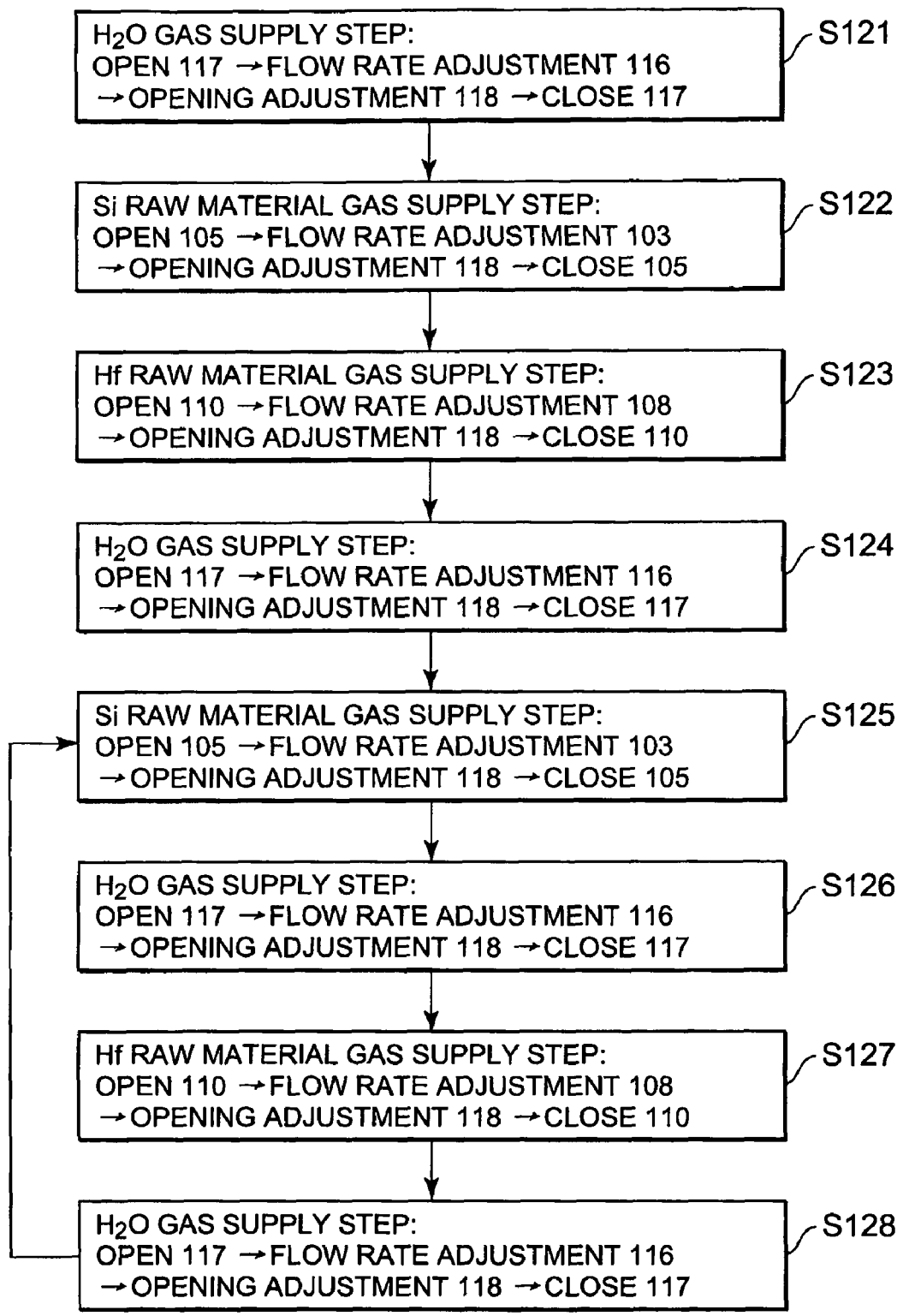
FIG. 34 is a flowchart showing a control process of the film formation apparatus in Example 4 of the present invention.

FIG. 34 shows a control process of a film formation apparatus used in Example 4.

In FIG. 34, in a $H_2O$ gas supply step of step S121, the valve 117 is opened, the $H_2O$ gas flow rate is adjusted by the mass flow controller 116, the opening of the conductance valve 118 is adjusted, and then the valve 117 is closed. Subsequently, in a Si raw material gas supply step of step S122, the valve 105 is opened, the Si raw material gas flow rate is adjusted by the mass flow controller 103, the opening of the conductance valve 118 is adjusted, and then the valve 105 is closed. Subsequently, in a Hf raw material gas supply step of step S123, the valve 110 is opened, the bubbling gas flow rate is adjusted by the mass flow controller 108, the opening of the conductance valve 118 is adjusted, and then the valve 110 is closed. Subsequently, in a $H_2O$ gas supply step of step S124, the valve 117 is opened, the $H_2O$ gas flow rate is adjusted by the mass flow controller 116, the opening of the conductance valve 118 is adjusted, and then the valve 117 is closed.

Subsequently, in a Si raw material gas supply step of step S125, the valve 105 is opened, the Si raw material gas flow rate is adjusted by the mass flow controller 103, the opening of the conductance valve 118 is adjusted, and then the valve 105 is closed. Subsequently, in a $H_2O$ gas supply step of step S126, the valve 117 is opened, the $H_2O$ gas flow rate is adjusted by the mass flow controller 116, the opening of the conductance valve 118 is adjusted, and then the valve 117 is closed. Subsequently, in a Hf raw material gas supply step of step S127, the valve 110 is opened, the bubbling gas flow rate is adjusted by the mass flow controller 108, the opening of the conductance valve 118 is adjusted, and then the valve 110 is closed. Subsequently, in a $H_2O$ gas supply step of step S128, the valve 117 is opened, the $H_2O$ gas flow rate is adjusted by the mass flow controller 116, the opening of the conductance valve 118 is adjusted, and then the valve 117 is closed.

A repeated cycle consisting of four steps of step S125 to step S128 is performed until reaching a range of 1 to 100 cycles. When supplying gas mixture of the Hf raw material and the Si raw material, a series of control operations are performed in step S123 and step S127, consisting of open operation of the valve 105 and the valve 110, flow rate adjustment by the mass flow controller 103 and the mass flow controller 108, opening adjustment for the conductance valve 118, and close operation of the valve 105 and the valve 110. An experiment was conducted also on a case in which a displacement gas (inert gas) was supplied at the same time with the supply of the raw material gas in a treatment gas supply process.

In Example 4, a $SiO_2$ molecular layer and a $HfO_2$ molecular layer were stacked alternately. As a result, variation in the deposition density due to the surface state of the substrate to be treated was eliminated, and controllability having favorable linearity could be obtained from a low deposition density region. Further, similar result could be obtained also in the case in which a step to replace the raw material gas and the oxidation gas was provided between the steps.

EXAMPLE 5

Figure 35:
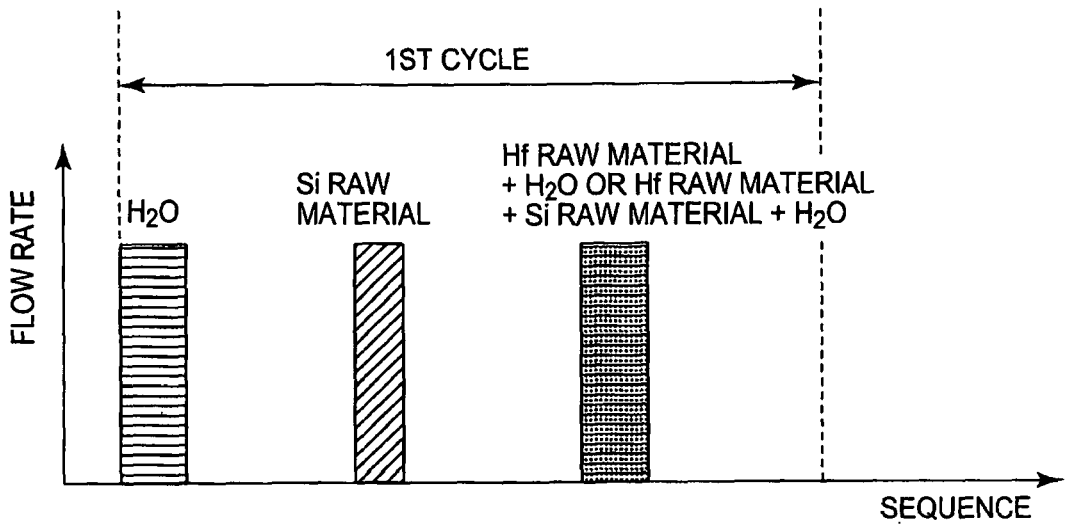
FIG. 35 is a sequence diagram showing a process for supplying raw material gases and an oxidation gas according to Example 5 of the present invention.

FIG. 35 is a sequence diagram showing a gas supply method according to Example 5. Example 5 is different from Example 1 shown in FIG. 18 in that a Hf raw material gas and $H_2O$ gas, or a Hf raw material gas, a Si raw material gas and H2O gas were supplied at the same time in a supply process of the third step. Film formation was performed by using the film formation apparatus shown in FIG. 2. An experiment was conducted also on a case in which a step for gas displacement was provided between the steps.

Figure 36:
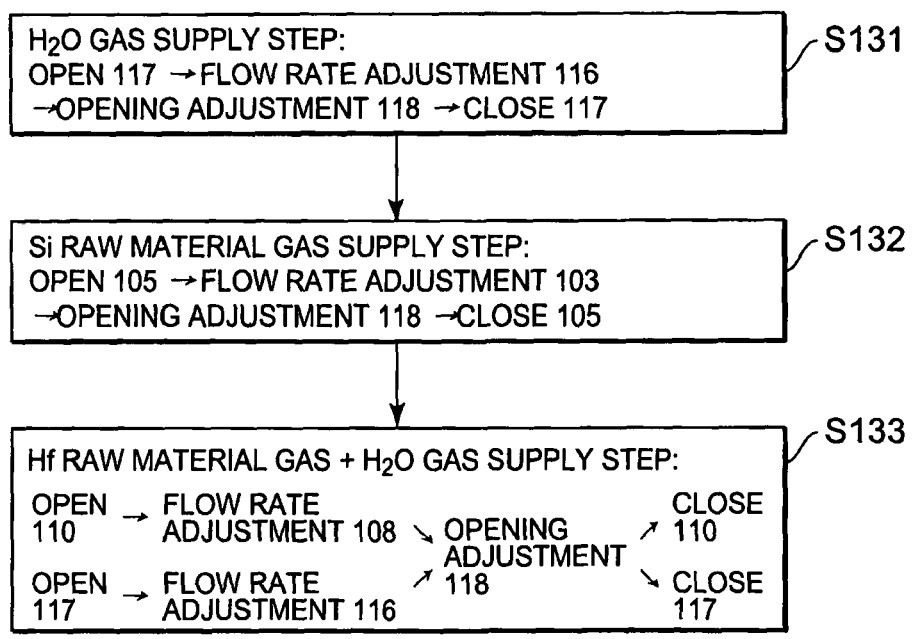
FIG. 36 is a flowchart showing a control process of the film formation apparatus in Example 5 of the present invention.

FIG. 36 shows a control process of a film formation apparatus used in Example 5.

Referring to FIG. 36, in a $H_2O$ gas supply step of step S131, the valve 117 is opened, the $H_2O$ gas flow rate is adjusted by the mass flow controller 116, the opening of the conductance valve 118 is adjusted, and then the valve 117 is closed. Subsequently, in a Si raw material gas supply step of step S132, the valve 105 is opened, the Si raw material gas flow rate is adjusted by the mass flow controller 103, the opening of the conductance valve 118 is adjusted, and then the valve 105 is closed. Subsequently, in a step of supplying a Hf raw material gas and $H_2O$ gas of step S133, the valve 110 and the valve 117 are opened, the flow rate of the bubbling gas and the $H_2O$ gas is adjusted by the mass flow controller 108 and the mass flow controller 116, the opening of the conductance valve 118 is adjusted, and then the valve 110 and the valve 117 are closed. When supplying gas mixture of the Hf raw material gas and the Si raw material gas together with the $H_2O$ gas, a series of control operations are performed in step S133, consisting of open operation of the valves 105, 110 and 117, flow rate adjustment by the mass flow controllers 103, 108 and 116, opening adjustment for the conductance valve 118, and close operation of the valves 105, 110 and 117.

In Example 5, the Hf deposition density was evaluated in relation to the supply time of the raw material and $H_2O$ gas after the second step, and it was found that there was no incubation time and controllability having favorable linearity could be obtained.

As described above, the present invention was proved to be effective not only in the atomic layer adsorption/deposition method described above but also in the CVD method for suppressing the incubation time and improving the controllability and reproducibility of the deposition density. Further, similar effects could be obtained also for the case in which a step of displacing the raw material gas and the oxidation gas was set between the steps.

EXAMPLE 6

Figure 37:
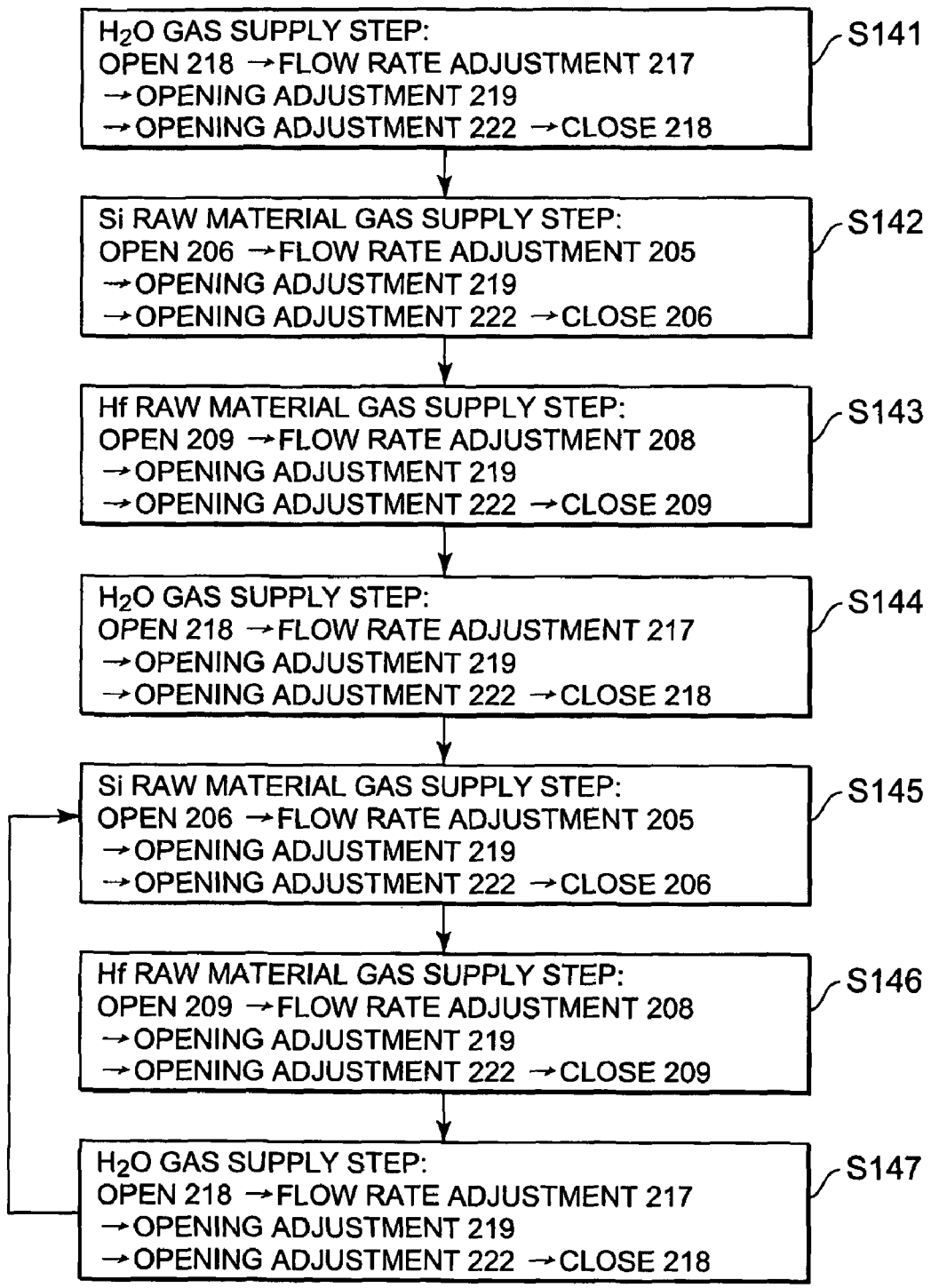
FIG. 37 is a flowchart showing a control process of the film formation apparatus in Example 6 of the present invention.

FIG. 37 is a diagram showing a control process of the film formation apparatus according to Example 6. In Example 6, the gas supply sequence of the second embodiment shown in FIG. 7 was performed by the film formation apparatus shown in FIG. 3.

Referring to FIG. 37, in a $H_2O$ gas supply step of step S141, the valve 218 is opened, the $H_2O$ gas flow rate is adjusted by the mass flow controller 217, the opening of the conductance valves 222 and 219 is adjusted, and then the valve 218 is closed. Subsequently, in a Si raw material gas supply step of step S142, the valve 206 is opened, the Si raw material gas flow rate is adjusted by the mass flow controller 205, the opening of the conductance valves 222 and 219 is adjusted, and then the valve 206 is closed. Subsequently, in a Hf raw material gas supply step of step S143, the valve 209 is opened, the Hf raw material gas flow rate is adjusted by the mass flow controller 208, the opening of the conductance valves 222 and 219 is adjusted, and then the valve 209 is closed. Subsequently, in a $H_2O$ gas supply step of step S144, the valve 218 is opened, the $H_2O$ gas flow rate is adjusted by the mass flow controller 217, the opening of the conductance valves 222 and 219 is adjusted, and then the valve 218 is closed.

Step S145 to step S147 are the same as those of the step S142 to step S144. A repeated cycle consisting of three steps of step S145 to step S147 was performed until reaching a range of 1 to 100 cycles. When supply gas mixture of the Hf raw material gas and the Si raw material gas, a series of control operations are performed in step S143 and S146, consisting of open operation of the valve 209 and the valve 206, flow rate adjustment by the mass flow controller 208 and the mass flow controller 205, opening adjustment for the conductance valves 222 and 219, and close operation of the valves 209 and 206.

The temperature of the substrate to be treated was set from 200° C. to 500° C., and the pressure in the film formation chamber was set within a range from $1E^{-4}$ Torr to 100 Torr. Other detailed conditions are the same as those in Example 1 to Example 4. Similar evaluation to that in Examples 1 to 4 was conducted in Example 6, and it was found that the effects as follows were obtained.

(1) A Hf deposition density of 1E14 atoms/cm² or lower per cycle, which is difficult to achieve in the prior art, can be achieved.

(2) The Hf deposition density can be arbitrarily controlled not only by means of the number of cycles of film formation but also by means of the supply amount or partial supply pressure of Si raw material.

(3) The Hf adsorption sites are determined by the Si deposition state. Therefore, the Hf deposition state is determined in a self-consistent manner, causing the growth termination mechanism to work. As a result, favorable in-plane uniformity, controllability, reproducibility, and process margin can be obtained.

(4) Variation in the Hf deposition density due to difference in the surface state of the substrate to be treated can be suppressed.

(5) Effect of incubation time can be suppressed, and the linearity of Hf deposition density to the number of cycles or film formation time can be improved.

As described above, the advantageous effects of the present invention can be obtained also when the raw material gas and the oxidation gas are supplied along the surface of the substrate to be treated.

EXAMPLE 7

Figure 38:
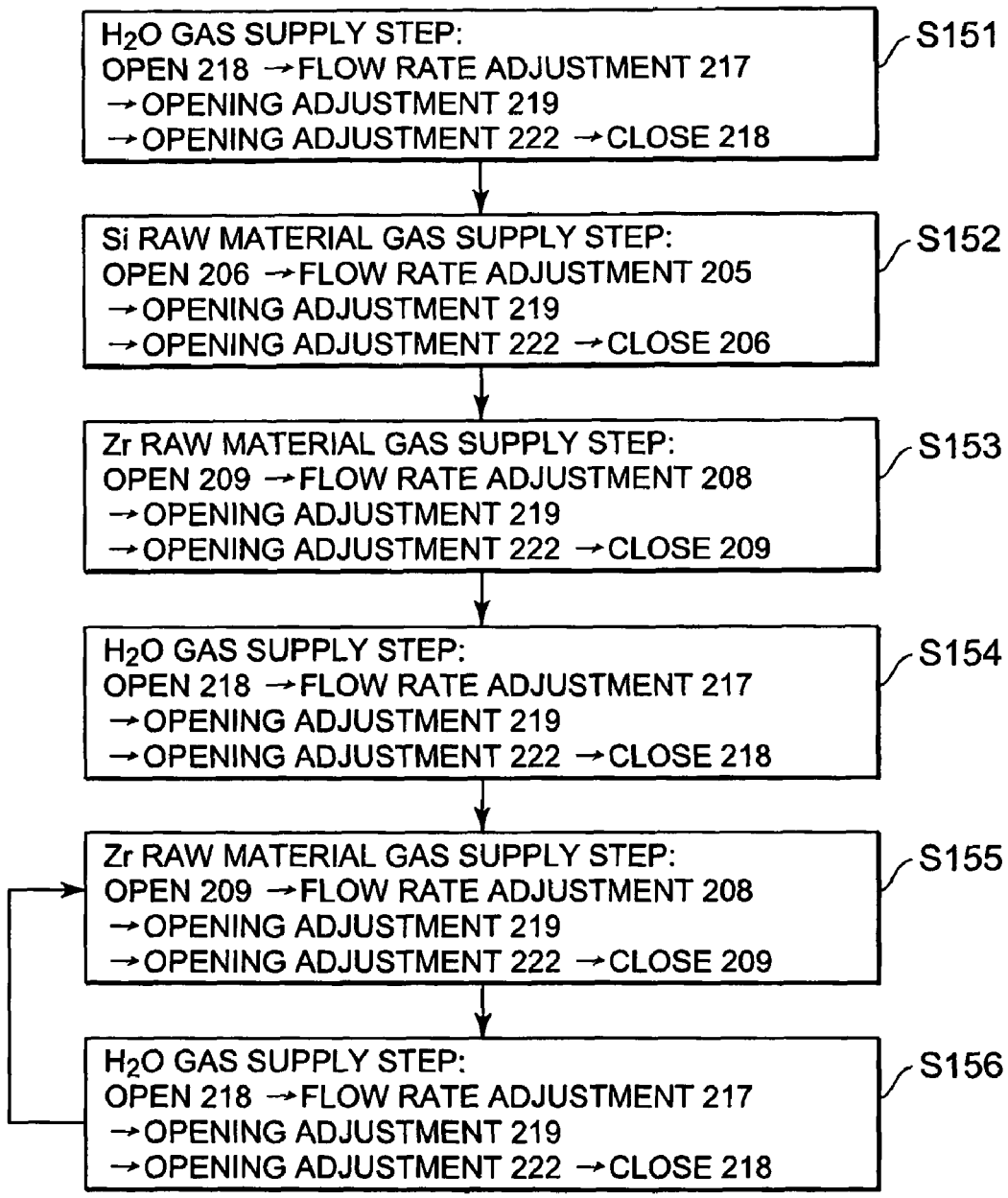
FIG. 38 is a flowchart showing a control process of the film formation apparatus in Example 7 of the present invention.

FIG. 38 is a diagram showing a control process of a film formation apparatus used in Example 7. In Example 7, the gas supply sequence of the third embodiment shown in FIG. 10 was performed by the film formation apparatus shown in FIG. 3.

Referring to FIG. 38, in a $H_2O$ gas supply step of step S151, the valve 218 is opened, the $H_2O$ gas flow rate is adjusted by the mass flow controller 217, and the opening of the conductance valves 222 and 219 is adjusted, and then the valve 218 is closed. Subsequently, in a Si raw material gas supply step of step S152, the valve 206 is opened, the Si raw material gas flow rate is adjusted by the mass flow controller 205, the opening of the conductance valves 222 and 219 is adjusted, and then the valve 206 is closed. Subsequently, in a Zr raw material gas supply step of step S153, the valve 209 is opened, the Zr raw material gas flow rate is adjusted by the mass flow controller 208, the opening of the conductance valves 222 and 219 is adjusted, and then the valve 209 is closed. Subsequently, in a $H_2O$ gas supply step of step S154, the valve 218 is opened, the $H_2O$ gas flow rate is adjusted by the mass flow controller 217, the opening of the conductance valves 222 and 219 is adjusted, and then the valve 218 is closed.

Step S155 to step S156 are the same as those of the step S153 to step S154, and a repeated cycle consists of step S155 to step S156.

Example 7 is different from Example 1 described above in that tetrakis(diethyl-amino)zirconium $(Zr[(C_2H_5)_2N]_4)$ was used as a metal raw material to form an oxide containing Zr and Si, while the other conditions were the same as in Example 1. Similar evaluation to that in Examples 1 to 4 was conducted in Example 6, and it was found that equivalent effects could be obtained.

EXAMPLE 8

Figure 39:
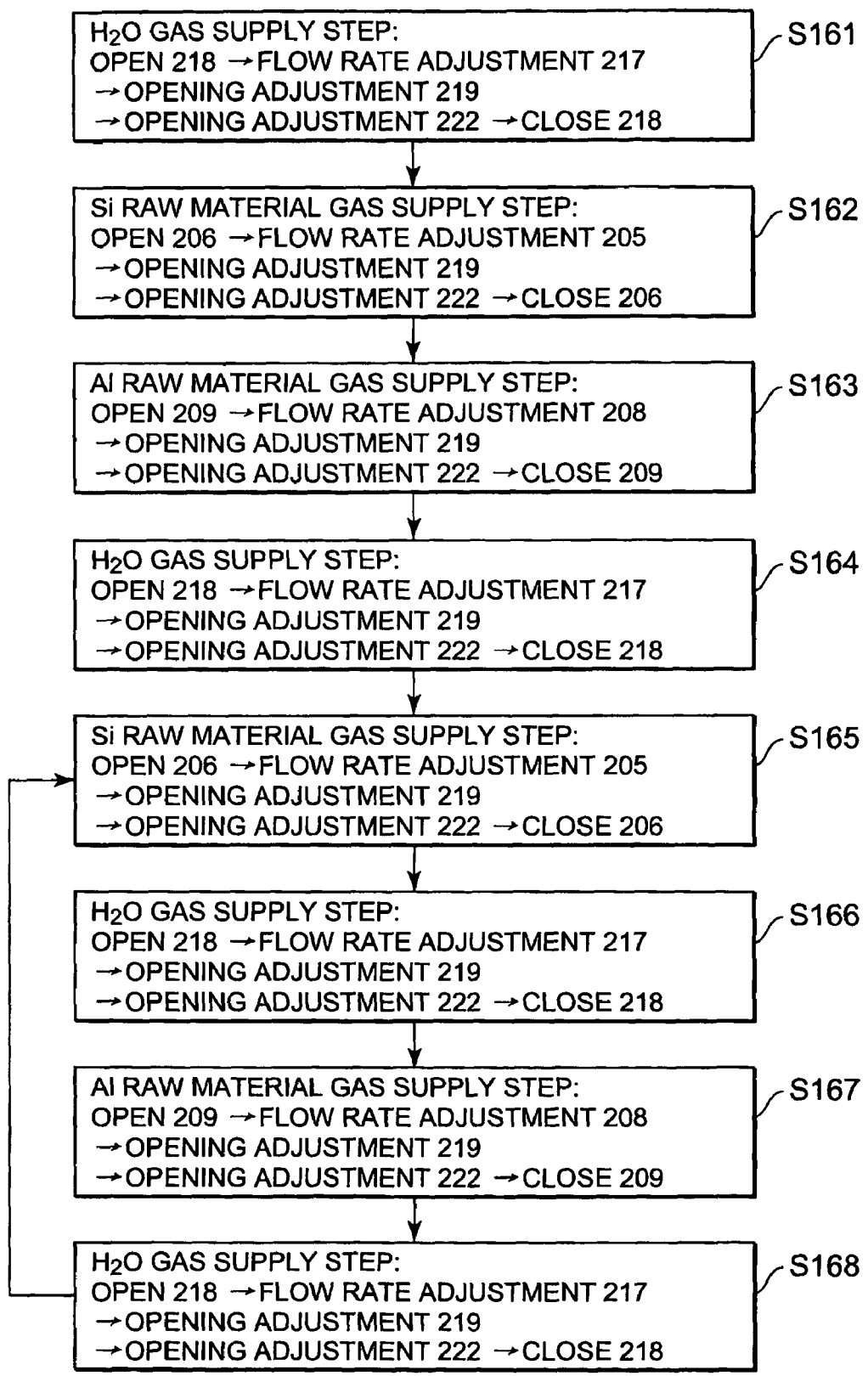
FIG. 39 is a flowchart showing a control process of the film formation apparatus in Example 8 of the present invention.

FIG. 39 is a diagram showing a control process of a film formation apparatus used in Example 8. In Example 8, the gas supply sequence of the fourth embodiment shown in FIG. 13 was performed by the film formation apparatus shown in FIG. 3.

Referring to FIG. 39, in a $H_2O$ gas supply step of step S161, the valve 218 is opened, the $H_2O$ gas flow rate is adjusted by the mass flow controller 217, the opening of the conductance valves 222 and 219 is adjusted, and then the valve 218 is closed. Subsequently, in a Si raw material gas supply step of step S162, the valve 206 is opened, the Si raw material gas flow rate is adjusted by the mass flow controller 205, the opening of the conductance valves 222 and 219 is adjusted, and then the valve 206 is closed. Subsequently, in an Al raw material gas supply step of step S163, the valve 209 is opened, the Al raw material gas flow rate is adjusted by the mass flow controller 208, the opening of the conductance valves 222 and 219 is adjusted, and then the valve 209 is closed. Subsequently, in a $H_2O$ gas supply step of step S164, the valve 218 is opened, the $H_2O$ gas flow rate is adjusted by the mass flow controller 217, the opening of the conductance valves 222 and 219 is adjusted, and then the valve 218 is closed.

Subsequently, in a Si raw material gas supply step of step S165, the valve 206 is opened, the Si raw material gas flow rate is adjusted by the mass flow controller 205, the opening of the conductance valves 222 and 219 is adjusted, and then the valve 206 is closed. Subsequently, in a $H_2O$ gas supply step of step S166, the valve 218 is opened, the $H_2O$ gas flow rate is adjusted by the mass flow controller 217, the opening of the conductance valves 222 and 219 is adjusted, and then the valve 218 is closed. Subsequently, in an Al raw material gas supply step of step S167, the valve 209 is opened, the Al raw material gas flow rate is adjusted by the mass flow controller 208, the opening of the conductance valves 222 and 219 is adjusted, and then the valve 209 is closed. Subsequently, in a $H_2O$ gas supply step of step S168, the valve 218 is opened, the $H_2O$ gas flow rate is adjusted by the mass flow controller 217, the opening of the conductance valves 222 and 219 is adjusted, and then the valve 218 is closed.

A repeated cycle is formed by step S165 to step S168. When supplying gas mixture of the Al raw material gas and the Si raw material gas in step S163 and step S167, a series of control operations are performed in each step, consisting of open operation of the valves 209 and 206, flow rate adjustment by the mass flow controllers 208 and 205, opening adjustment for the conductance valves 222 and 219, and close operation of the valves 209 and 206.

Example 7 is different from Examples 6 and 7 described above in that trimethyl aluminum $(Al(CH_3)_3)$ was used as a metal raw material to form an oxide containing Al and Si, while the other conditions were the same as in Example 1. Similar evaluation to that in Examples 1 to 6 was conducted, and it was found that the advantageous effects as follows could be obtained in Example 7.

As described above, when depositing a metal element M on the surface of a substrate to be treated in the method for manufacturing semiconductor devices according to the present invention, a step in which an oxidation gas is firstly supplied onto the substrate to be treated and then a first raw material gas containing Si is supplied onto the substrate to be treated is performed before a step of supplying a second raw material gas containing the metal element M. This makes it possible to control the supply time or the partial pressure of the first raw material gas and thus to control the deposition density of the metal element M as required. Accordingly, advantageous effects as follows can be obtained.

(1) A deposition density of the metal element M of 1E14 atoms/$cm^2$ or lower per cycle, which is difficult to achieve in the prior art, can be achieved.

(2) The deposition density of the metal element M can be arbitrarily controlled not only by means of the number of cycles of film formation but also by means of the supply amount or partial supply pressure of the Si raw material.

(3) The adsorption sites of the metal element M are determined by the Si deposition state. Therefore, the deposition state thereof is determined in a self-consistent manner, causing the growth termination mechanism to work. As a result, favorable in-plane uniformity, controllability, reproducibility, and process margin can be obtained.

(4) Variation in the deposition density of the metal element M due to difference in the surface state of the substrate to be treated can be suppressed.

(5) Effect of incubation time can be suppressed, and the linearity of the metal element deposition density to the number of cycles or film formation time can be improved.

The invention claimed is:

1. A semiconductor device manufacturing method including a film formation method of forming a film of a metal oxide containing a metal element M and Si as components on a substrate to be treated containing at least Si as constituent elements by using a first raw material gas containing Si, a second raw material gas containing the metal element M, and an oxidation gas, the method sequentially performing a first step of supplying said oxidation gas, a second step of supplying said first raw material gas, and a third step of supplying said second raw material gas or gas mixture of said second raw material gas and said first raw material gas, onto said substrate to be treated, wherein a fourth step of supplying said oxidation gas onto said substrate to be treated is performed following said third step and, further, one or a plurality of cycles are performed, each cycle consisting of four steps: a fifth step of supplying said first raw material gas, a sixth step of supplying said oxidation gas, a seventh step of supplying said second raw material gas or gas mixture of said first raw material gas and said second raw material gas, and an eighth step of supplying said oxidation gas.

2. The semiconductor device manufacturing method according to claim 1, wherein one or a plurality of cycles each consisting of said second step to said fourth step are performed.

3. The semiconductor device manufacturing method according to claim 1, wherein one or a plurality of cycles each consisting of said third step to said fourth step are performed.

4. The semiconductor device manufacturing method according to claim 1, wherein the deposition density of said metal element M is $1 \times 10^{14}$ atoms/cm$^2$ or lower in the deposition step of said metal element M.

5. The semiconductor device manufacturing method according to claim 1, wherein the supply amount of said first raw material gas is adjusted in said first raw material gas supply step, whereby the deposition density of said metal element M is controlled.

6. The semiconductor device manufacturing method according to claim 1, wherein the partial pressure of said first raw material gas is adjusted in said first raw material gas supply step, whereby the deposition density of said metal element M is controlled.

7. The semiconductor device manufacturing method according to claim 1, wherein the partial pressure of said first raw material gas is $1 \times 10^{-4}$ Torr (0.0133 Pa) or higher in said first raw material gas supply step.

8. The semiconductor device manufacturing method according to claim 1, wherein said first raw material gas, said second raw material gas or said oxidation gas is supplied together with a gas selected from the group consisting of $N_2$, Ar, and He.

9. The semiconductor device manufacturing method according to claim 1, wherein said metal element M is an element selected from the group consisting of Hf, Zr, Al, La, Pr, Y, Ti, Ta and W.

10. The semiconductor device manufacturing method according to claim 1, wherein no oxygen is contained as a constituent element of said first raw material gas or said second raw material gas.

11. The semiconductor device manufacturing method according to claim 1, wherein said first raw material gas is selected from the group consisting of $Si[(CH_3)_2N]_4$, $Si[(CH_3)_2N]_3H$, $Si[(C_2H_5)_2N]_3H$, and $Si[(CH_3)_2N]_2H_2$.

12. The semiconductor device manufacturing method according to claim 1, wherein said second raw material gas is selected from the group consisting of $Hf[(CH_3)_2N]_4$, $Hf[(CH_3)(C_2H_5)N]_4$, $Hf[(C_2H_5)_2N]_4$, $Zr[(CH_3)_2N]_4$, $Zr[(CH_3)(C_2H_5)N]_4$, $Zr[(C_2H_5)_2N]_4$, and $Al(CH_3)_3$.

13. The semiconductor device manufacturing method according to claim 1, wherein said second raw material gas is a mixture of at least one raw material selected from the group consisting of $Si[(CH_3)_2N]_4$, $Si[(CH_3)_2N]_3H$, $Si[(C_2H_5)_2N]_3H$, and $Si[(CH_3)_2N]_2H_2$ and at least one raw material selected from the group consisting of $Hf[(CH_3)_2N]_4$, $Hf[(CH_3)(C_2H_5)N]_4$, $Hf[(C_2H_5)_2N]_4$, $Zr[(CH_3)_2N]_4$, $Zr[(CH_3)(C_2H_5)N]_4$, $Zr[(C_2H_5)_2N]_4$, and $Al(CH_3)_3$.

14. The semiconductor device manufacturing method according to claim 1, wherein said oxidation gas is selected from the group consisting of $H_2O$, $D_2O$, ozone, and oxygen.

15. The semiconductor device manufacturing method according to claim 1, wherein the temperature of said substrate to be treated is in the range from 200° C. to 500° C.

16. The semiconductor device manufacturing method according to claim 1, wherein a step is interposed between two successive steps, for displacing a gas used in the precedent step of the two steps.

17. The semiconductor device manufacturing method according to claim 1, wherein the surface of said substrate to be treated is formed of $SiO_2$ or SiON.

18. A semiconductor device manufacturing including a film formation method of forming a film of a metal oxide containing a metal element M and Si as components on a substrate to be treated containing at least Si as constituent elements by using a first raw material gas containing Si, a second raw material gas containing the metal element M, and an oxidation gas, the method sequentially performing a first step of supplying said oxidation gas, a second step of supplying said first raw material gas, and a third step of supplying gas containing said second raw material gas onto said substrate to be treated, wherein said second raw material gas is supplied simultaneously with said oxidation gas, or gas mixture of said first raw material gas and said second raw material gas is supplied simultaneously with said oxidation gas as said third step, and then one or a plurality of cycles each consisting of said first to third steps are performed.

* * * * *